(12) United States Patent
Kwak

(10) Patent No.: US 10,008,512 B2
(45) Date of Patent: Jun. 26, 2018

(54) SEMICONDUCTOR DEVICE AND METHOD OF MANUFACTURING THE SAME

(71) Applicant: SK hynix Inc., Icheon-si, Gyeonggi-do (KR)

(72) Inventor: Sang Hyon Kwak, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/581,658

(22) Filed: Apr. 28, 2017

(65) Prior Publication Data

US 2017/0229477 A1 Aug. 10, 2017

Related U.S. Application Data

(63) Continuation of application No. 14/969,144, filed on Dec. 15, 2015, now Pat. No. 9,673,212.

(30) Foreign Application Priority Data

Jun. 29, 2015 (KR) .......................... 10-2015-0092019

(51) Int. Cl.
| | | |
|---|---|---|
| *H01L 27/11582* | (2017.01) | |
| *H01L 21/28* | (2006.01) | |
| *H01L 27/11524* | (2017.01) | |
| *H01L 27/11556* | (2017.01) | |
| *H01L 27/1157* | (2017.01) | |
| *H01L 29/788* | (2006.01) | |

(52) U.S. Cl.
CPC .. *H01L 27/11582* (2013.01); *H01L 21/28273* (2013.01); *H01L 21/28282* (2013.01); *H01L 27/1157* (2013.01); *H01L 27/11524* (2013.01); *H01L 27/11556* (2013.01); *H01L 29/7883* (2013.01)

(58) Field of Classification Search
CPC ................................................. H01L 27/11582
USPC ........................................................ 257/314
See application file for complete search history.

(56) References Cited

U.S. PATENT DOCUMENTS

2013/0153978 A1* 6/2013 Lee .................. H01L 29/66833
257/314
2014/0077285 A1* 3/2014 Noda ................ H01L 27/11582
257/324

FOREIGN PATENT DOCUMENTS

KR 1020150116510 A 10/2015

* cited by examiner

*Primary Examiner* — Moazzam Hossain
*Assistant Examiner* — Warren H Kilpatrick
(74) *Attorney, Agent, or Firm* — William Park & Associates Ltd.

(57) ABSTRACT

A semiconductor device may include pipe channel layer, and a pipe gate surrounding the pipe channel layer. The semiconductor device may include an oxidization layer formed between the pipe gate and the pipe channel layer. The semiconductor device may include a source side channel layer and a drain side channel layer extended from the pipe channel layer to protrude further than the oxidization layer.

18 Claims, 14 Drawing Sheets

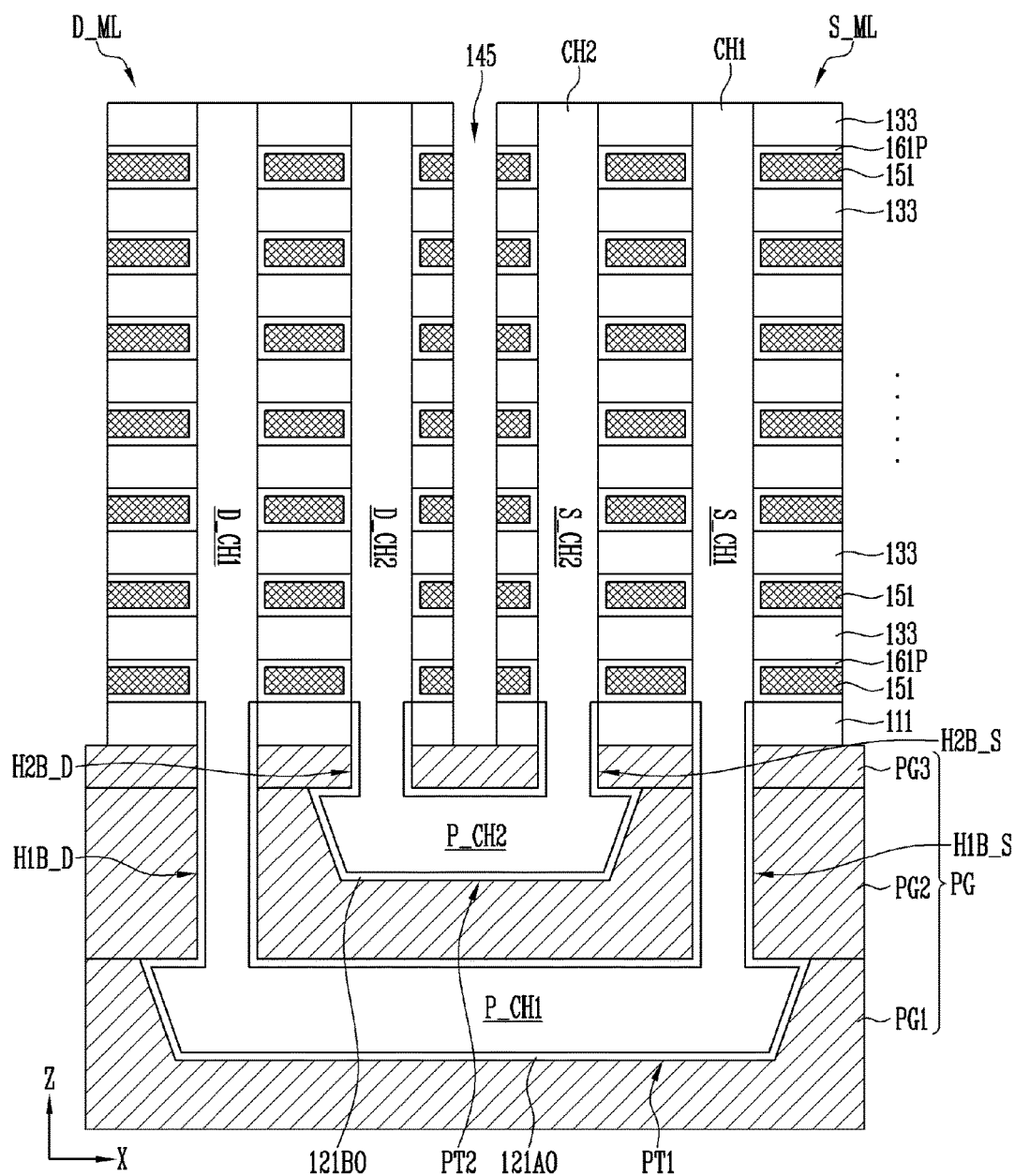

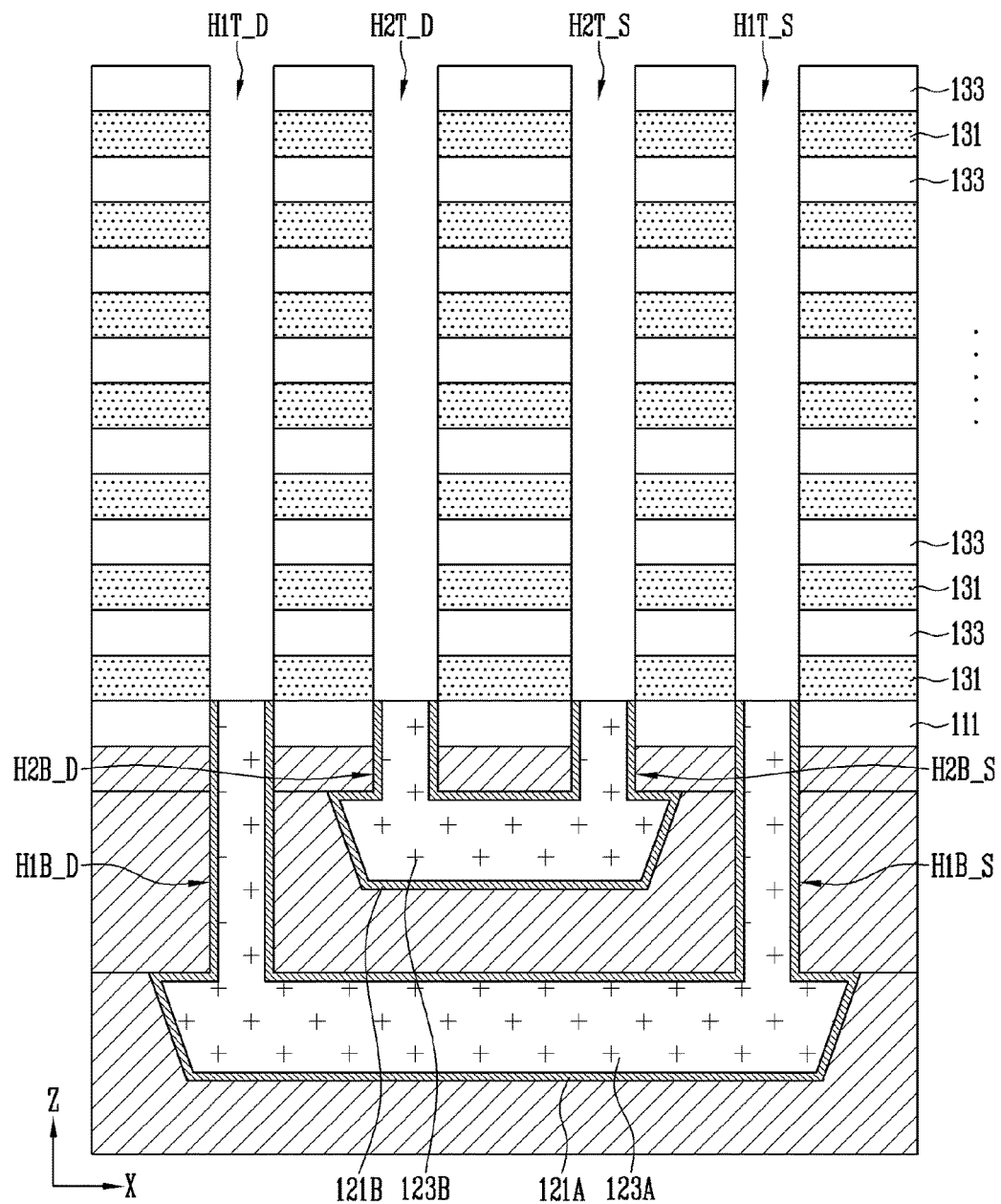

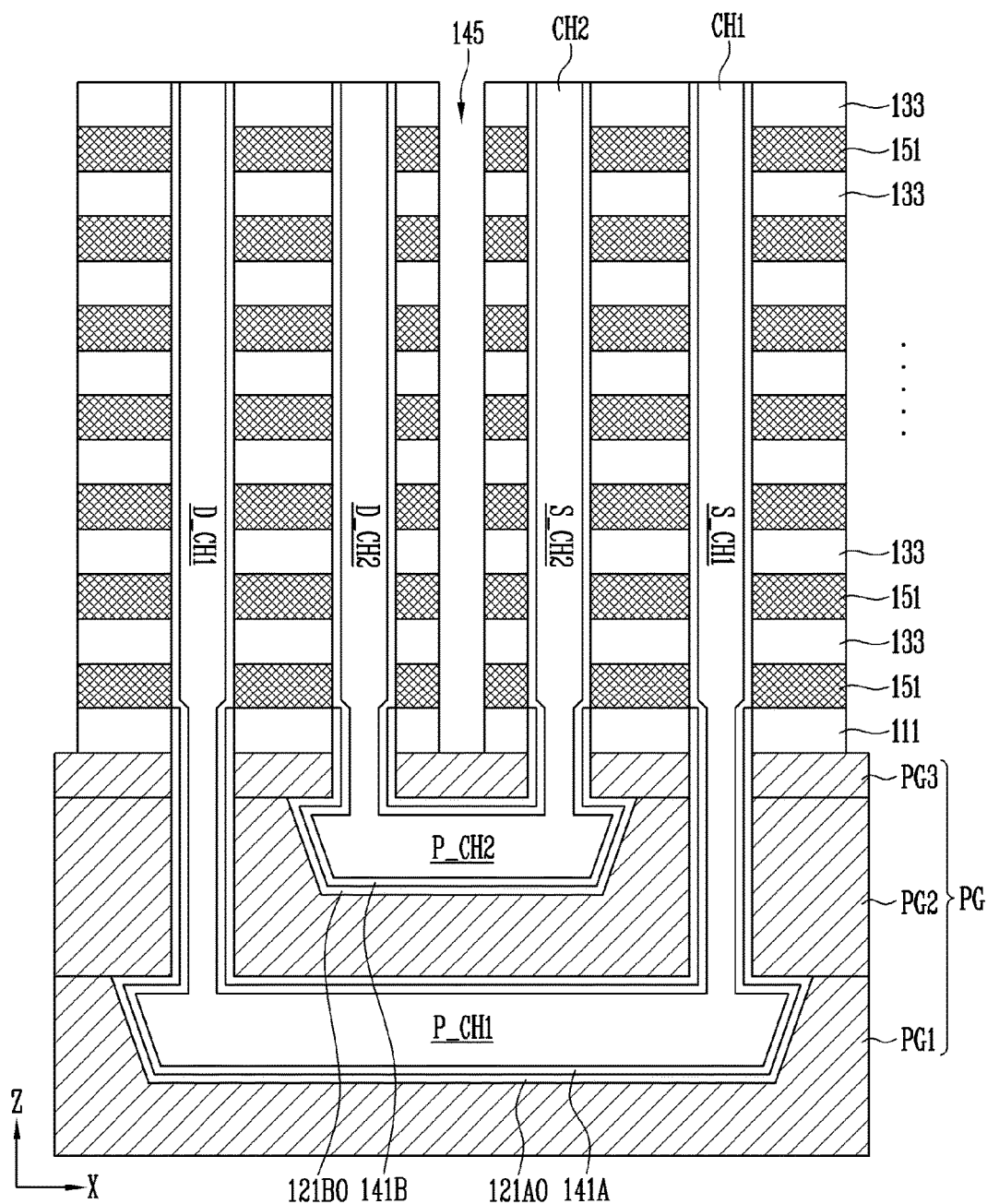

SEMICONDUCTOR DEVICE AND METHOD OF MANUFACTURING THE SAME

CROSS-REFERENCE TO RELATED APPLICATION

The present application is a continuation application of U.S. application Ser. No. 14/969,144, filed on Dec. 15, 2015, and claims priority to Korean patent application number 10-2015-0092019 filed on Jun. 29, 2015, in the Korean Intellectual Property Office, the entire disclosure of which is incorporated by reference herein.

BACKGROUND

1. Technical Field

The present disclosure generally relates to a semiconductor device and a method of manufacturing the same, and more particularly, to a three-dimensional memory device and a method of manufacturing the same.

2. Related Art

A semiconductor device includes a memory device capable of storing data. The memory device includes memory cells. In order to highly integrate the semiconductor device, the memory cells may be three-dimensionally arranged. For example, a three-dimensional memory device, in which the memory cells stacked in two columns are connected with a pipe transistor, has been suggested. A process of forming the memory cells may influence a structure of the pipe transistor.

SUMMARY

In an embodiment, a semiconductor device may be provided. The semiconductor device may include a pipe channel layer, a pipe gate surrounding the pipe channel layer, and an oxidization layer formed between the pipe gate and the pipe channel layer. The semiconductor device may include a source side channel layer and a drain side channel layer extended from the pipe channel layer to protrude further than the oxidization layer.

In an embodiment, a semiconductor device may be provided. The semiconductor device may include a first pipe gate having a first concave portion, and a second pipe gate formed on the first pipe gate and having a second concave portion. The semiconductor device may include a third pipe gate formed on the second pipe gate, and a first insulating layer formed on the third pipe gate. The semiconductor device may include a first source side pipe through-hole and a first drain side pipe through-hole connected to the first concave portion while passing through the first insulating layer, the third pipe gate, and the second pipe gate. The semiconductor device may include a second source side pipe through-hole and a second drain side pipe through-hole connected to the second concave portion while passing through the first insulating layer and the third pipe gate. The semiconductor device may include a first pipe channel layer formed inside the first source side pipe through-hole, the first drain side pipe through-hole, and the first concave portion. The semiconductor device may include a first oxidization layer formed along a surface of the first pipe channel layer, and extending only up to a height of the first insulating layer. The semiconductor device may include a second pipe channel layer formed inside the second source side pipe through-hole, the second drain side pipe through-hole, and the second concave portion. The semiconductor device may include a second oxidization layer formed along a surface of the second pipe channel layer, and extending only up to the height of the first insulating layer.

In an embodiment, there may be provided a method of manufacturing a semiconductor device. The method may include forming a lower structure including a gap fill layer, a pipe gate surrounding the gap fill layer, and a passivation layer disposed between the pipe gate and the gap fill layer. The method may include alternately stacking sacrificial layers and insulating layers on the lower structure. The method may include forming a source side through-hole and a drain side through-hole exposing the gap fill layer by etching the sacrificial layers and the insulating layers. The method may include exposing the passivation layer by removing the gap fill layer through the source side through-hole and the drain side through-hole. The method may include forming a passivation oxidization region, which is the oxidized passivation layer, and sacrificial oxidization regions, which are oxidized lateral walls of the sacrificial layers exposed through the source side through-hole and the drain side through-hole, by an oxidization process. The method may include forming a channel layer surrounded by the passivation oxidization region and the sacrificial oxidization regions and filling the source side through-hole, the drain side through-hole and a region, in which the gap fill layers are removed.

In an embodiment, a method of manufacturing a semiconductor device may be provided. The method may include forming a lower structure including a first pipe gate, a second pipe gate stacked on the first pipe gate, a third pipe gate stacked on the second pipe gate, a first insulating layer stacked on the third pipe gate, a first gap fill layer, which passes through the first insulating layer, the third pipe gate, and the second pipe gate, is filled in a first concave portion of the first pipe gate, and is surrounded by a first passivation layer, and a second gap fill layer, which passes through the first insulating layer and the third pipe gate, is filled in a second concave portion of the second pipe gate, and is surrounded by a second passivation layer. The method may include alternately stacking sacrificial layers and second insulating layers on the lower structure. The method may include forming a first source side through-hole and a first drain side through-hole exposing the first gap fill layer and a second source side through-hole and a second drain side through-hole exposing the second gap fill layer by etching the sacrificial layers and the second insulating layers. The method may include exposing the first and second passivation layers by removing the first and second gap fill layers through the first and second source side through-holes and the first and second drain side through-holes. The method may include forming a first passivation oxidization region, which is the oxidized first passivation layer, a second passivation oxidization region, which is the oxidized second passivation layer, and sacrificial oxidization regions, which are oxidized lateral walls of the sacrificial layers exposed through the first and second source side through-holes and the first and second drain side through-holes, by an oxidization process. The method may include forming a first channel layer disposed within the first source side through-hole, the first drain side through-hole, and a region, in which the first gap fill layer is removed, and surrounded by the first passivation oxidization region and the sacrificial oxidization regions, and a second channel layer disposed within the second source side through-hole, the second drain side through-hole, and a region, in which the second gap fill layer is removed, and surrounded by the second passivation oxidization region and the sacrificial oxidization regions.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A and 2B are cross-sectional views illustrating representations of examples of semiconductor devices according to various embodiments.

FIGS. 3A to 3I are cross-sectional views illustrating representations of examples for describing a method of manufacturing the semiconductor device according to an embodiment illustrated in FIG. 2A.

DETAILED DESCRIPTION

Figure 1:
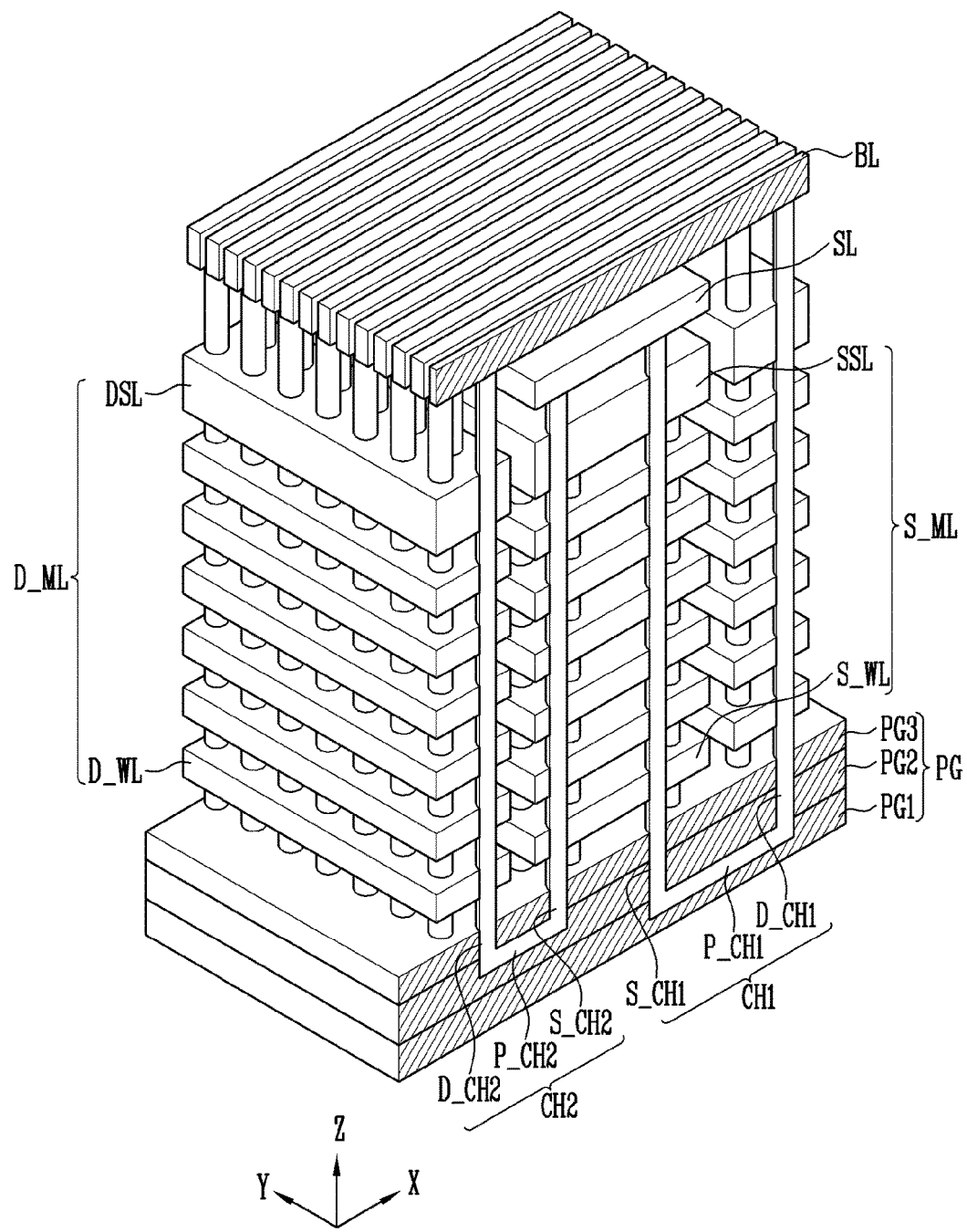
FIG. 1 is a perspective view illustrating a representation of an example of a semiconductor device according to an embodiment.

An embodiment may provide a semiconductor device capable of more stably securing a structure of a pipe transistor, and a method of manufacturing the same.

In an embodiment, a semiconductor device may be provided. The semiconductor device may include a pipe channel layer, a pipe gate surrounding the pipe channel layer, and an oxidization layer formed between the pipe gate and the pipe channel layer. The semiconductor device may include a source side channel layer and a drain side channel layer extended from the pipe channel layer to protrude further than the oxidization layer.

In an embodiment, a semiconductor device may be provided. The semiconductor device may include a first pipe gate having a first concave portion, and a second pipe gate formed on the first pipe gate and having a second concave portion. The semiconductor device may include a third pipe gate formed on the second pipe gate, and a first insulating layer formed on the third pipe gate. The semiconductor device may include a first source side pipe through-hole and a first drain side pipe through-hole connected to the first concave portion while passing through the first insulating layer, the third pipe gate, and the second pipe gate. The semiconductor device may include a second source side pipe through-hole and a second drain side pipe through-hole connected to the second concave portion while passing through the first insulating layer and the third pipe gate. The semiconductor device may include a first pipe channel layer formed inside the first source side pipe through-hole, the first drain side pipe through-hole, and the first concave portion. The semiconductor device may include a first oxidization layer formed along a surface of the first pipe channel layer, and extending only up to a height of the first insulating layer. The semiconductor device may include a second pipe channel layer formed inside the second source side pipe through-hole, the second drain side pipe through-hole, and the second concave portion. The semiconductor device may include a second oxidization layer formed along a surface of the second pipe channel layer, and extending only up to the height of the first insulating layer.

In an embodiment, a semiconductor device may be provided. The semiconductor device may include a first and second pipe channel layer. The semiconductor device may include a pipe gate surrounding the first and second pipe channel layers. The semiconductor device may include a first oxidization layer formed between the pipe gate and the first pipe channel layer. The semiconductor device may include a second oxidization layer formed between the pipe gate and the second pipe channel layer. The semiconductor device may include a first source side channel layer and a first drain side channel layer extended from the first pipe channel layer to protrude further than the first oxidization layer protruding past the pipe gate. The semiconductor device may include a second source side channel layer and a second drain side channel layer extended from the second pipe channel layer to protrude further than the second oxidization layer protruding past the pipe gate.

In an embodiment, there may be provided a method of manufacturing a semiconductor device. The method may include forming a lower structure including a gap fill layer, a pipe gate surrounding the gap fill layer, and a passivation layer disposed between the pipe gate and the gap fill layer. The method may include alternately stacking sacrificial layers and insulating layers on the lower structure. The method may include forming a source side through-hole and a drain side through-hole exposing the gap fill layer by etching the sacrificial layers and the insulating layers. The method may include exposing the passivation layer by removing the gap fill layer through the source side through-hole and the drain side through-hole. The method may include forming a passivation oxidization region, which is the oxidized passivation layer, and sacrificial oxidization regions, which are oxidized lateral walls of the sacrificial layers exposed through the source side through-hole and the drain side through-hole, by an oxidization process. The method may include forming a channel layer surrounded by the passivation oxidization region and the sacrificial oxidization regions and filling the source side through-hole, the drain side through-hole and a region, in which the gap fill layers are removed.

In an embodiment, a method of manufacturing a semiconductor device may be provided. The method may include forming a lower structure including a first pipe gate, a second pipe gate stacked on the first pipe gate, a third pipe gate stacked on the second pipe gate, a first insulating layer stacked on the third pipe gate, a first gap fill layer, which passes through the first insulating layer, the third pipe gate, and the second pipe gate, is filled in a first concave portion of the first pipe gate, and is surrounded by a first passivation layer, and a second gap fill layer, which passes through the first insulating layer and the third pipe gate, is filled in a second concave portion of the second pipe gate, and is surrounded by a second passivation layer. The method may include alternately stacking sacrificial layers and second insulating layers on the lower structure. The method may include forming a first source side through-hole and a first drain side through-hole exposing the first gap fill layer and a second source side through-hole and a second drain side through-hole exposing the second gap fill layer by etching the sacrificial layers and the second insulating layers. The method may include exposing the first and second passivation layers by removing the first and second gap fill layers through the first and second source side through-holes and the first and second drain side through-holes. The method may include forming a first passivation oxidization region, which is the oxidized first passivation layer, a second passivation oxidization region, which is the oxidized second passivation layer, and sacrificial oxidization regions, which are oxidized lateral walls of the sacrificial layers exposed through the first and second source side through-holes and the first and second drain side through-holes, by an oxidization process. The method may include forming a first channel layer disposed within the first source side through-hole, the first drain side through-hole, and a region, in which the first gap fill layer is removed, and surrounded by the first passivation oxidization region and the sacrificial oxidization regions, and a second channel layer disposed within the second source side through-hole, the second drain side through-hole, and a region, in which the second gap fill layer is removed, and surrounded by the second passivation oxidization region and the sacrificial oxidization regions.

Hereinafter, examples of embodiments will be described below with reference to the accompanying drawings. However, the embodiments not limited to the examples disclosed below, but may be variously implemented in different forms, and the scope of the embodiments not limited to the examples of embodiments to be described below. However, the embodiments are provided to be completely known to those skilled in the art, and the scope of the present disclosure should be understood by the claims.

FIG. 1 is a perspective view illustrating a representation of an example of a semiconductor device according to an embodiment of the present disclosure. For example, FIG. 1 is a perspective view of a three-dimensional (3D) memory device, and does not illustrate an insulating layer.

Referring to FIG. 1, a 3D memory device according an embodiment may include a first channel layer CH1, a second channel layer CH2, a pipe gate PG, a source side stack body S_ML, and a drain side stack body D_ML.

The pipe gate PG includes a first pipe gate PG1, a second pipe gate PG2 stacked on the first pipe gate PG1, and a third pipe gate PG3 stacked on the second pipe gate PG2.

The first channel layer CH1 includes a first pipe channel layer P_CH1, and a first source side channel layer S_CH1 and a first drain side channel layer D_CH1 protruding from the first pipe channel layer P_CH1 to an upper portion of the third pipe gate PG3. The first pipe channel layer P_CH1 is disposed within a first concave portion of the first pipe gate PG1, and may pass through the second pipe gate PG2 and the third pipe gate PG3 toward the first source side channel layer S_CH1 and a first drain side channel layer D_CH1. The first source side channel layer S_CH1 and the first drain side channel layer D_CH1 are extended toward a bit line BL and a common source line SL from the first pipe channel layer P_CH1.

The second channel layer CH2 includes a second pipe channel layer P_CH2, and a second source side channel layer S_CH2 and a second drain side channel layer D_CH2 protruding from the second pipe channel layer P_CH2 to an upper portion of the third pipe gate PG3. The second pipe channel layer P_CH2 is disposed within a second concave portion of the second pipe gate PG2, and may pass through the third pipe gate PG3 toward the second source side channel layer S_CH2 and a second drain side channel layer D_CH2. The second source side channel layer S_CH2 and the second drain side channel layer D_CH2 are extended toward the bit line BL and the common source line SL from the second pipe channel layer P_CH2.

The first pipe channel layer P_CH1 may include a horizontal portion filled in the first concave portion of the first pipe gate PG1, and protruding portions extended from a horizontal portion to a height of bottom surfaces of lowermost layer conductive patterns adjacent to the pipe gate PG among conductive patterns S_WL and SSL of the source side stack body S_ML and conductive patterns D_WL, DSL1, and DSL2 of the drain side stack body D_ML. Accordingly, the first pipe channel layer P_CH1 may have a U-shaped longitudinal section structure. The second pipe channel layer P_CH2 may include a horizontal portion filled in the second concave portion of the second pipe gate PG2, and protruding portions extended from a horizontal portion to a height of bottom surfaces of lowermost layer conductive patterns adjacent to the pipe gate PG among the conductive patterns S_WL and SSL of the source side stack body S_ML and the conductive patterns D_WL and DSL of the drain side stack body D_ML. Accordingly, the second pipe channel layer P_CH2 may have a U-shaped longitudinal section structure. The second pipe channel layer P_CH2 is formed at a higher position than that of the first pipe channel layer P_CH1, and is formed to be shorter than the first pipe channel layer P_CH1. Accordingly, compared to the pipe channel layers having the same height and the same length, in an embodiment of the present disclosure, it may be possible to densely dispose the first pipe channel layer P_CH1 and the second pipe channel layer P_CH2, thereby improving an integration degree of the memory device.

In an embodiment, each of the first channel layer CH1 and the second channel layer CH2 may be formed of a tube-type semiconductor layer surrounding an insulating material. In an embodiment, each of the first channel layer CH1 and the second channel layer CH2 may be formed of a buried semiconductor layer completely filled from a surface of a hole defining regions, in which the first channel layer CH1 and the second channel layer CH2 are disposed, to a center region of the hole. In an embodiment, each of the first channel layer CH1 and the second channel layer CH2 may be formed in a structure in which a buried type and a tube type are combined. Although not illustrated in the drawing, an external wall of each of the first channel layer CH1 and the second channel layer CH2 may be surrounded by a multilayer of three or more layers including a tunnel insulating layer, a memory layer, and a charge blocking layer. The first channel layer CH1 and the second channel layer CH2 may be alternately disposed in an extension direction (for example, an X-direction) of the bit lines BL and a direction (for example, a Y-direction) crossing the extension direction. The first channel layer CH1 and the second channel layer CH2 may be disposed in a zigzag form in the extension direction of the bit lines BL.

The source side stack body S_ML and the drain side stack body D_ML may be separated by a slit. The separation structure of the source side stack body S_ML and the drain side body D_ML may be variously changed according to a form of the slit.

The source side stack body S_ML is passed through by the first source side channel layer S_CH1 and the second source side channel layer S_CH2. The source side stack body S_ML includes source side word lines S_WL, which are stacked while being spaced apart from each other, and a source select line SSL of one or more layers stacked on the source side word lines S_WL. The source select line SSL may be formed with the same thickness as that of the source side word lines S_WL, or with a larger thickness than those of the source side word lines S_WL. The source select line SSL is spaced apart from the source side word lines S_WL. The source side word lines S_WL and the source select line SSL may be extended in the first direction (for example, the Y-direction) while surrounding the first source side channel layer S_CH1 and the second source side channel layer S_CH2.

The drain side stack body D_ML is passed through by the first drain side channel layer D_CH1 and the second drain side channel layer D_CH2. The drain side stack structure D_ML includes drain side word lines D_WL, which are stacked while being spaced apart from each other, and a drain select line DSL of one or more layers stacked on the drain side word lines D_WL. The drain select line DSL is spaced apart from the drain side word lines D_WL. The drain side word lines D_WL and the drain select line DSL may be extended in the first direction (for example, the Y-direction) while surrounding the first drain side channel layer D_CH1 and the second drain side channel layer D_CH2.

The source side stack body S_ML and the drain side stack body D_ML may be formed with the same height. The common source line SL and the bit lines BL are disposed on the source side stack body S_ML and the drain side stack body D_ML. The common source line SL and the bit lines BL are disposed while being spaced apart from each other. For example, the bit lines BL may be disposed on the common source line SL while being spaced apart from the source line SL.

The common source line SL is commonly connected to the first source side channel layer S_CH1 and the second source side channel layer S_CH2. The common source line SL may be extended in the first direction (Y-direction).

The bit lines BL may be extended in the second direction (for example, the X-direction) crossing the first direction (Y-direction). Each of the bit lines BL is connected to the first and second drain side channel layers D_CH1 and D_CH2 arranged in the extension thereof. Each of the bit lines BL may be connected to the first drain side channel layer D_CH1 and the second drain side channel layer D_CH2, which are alternately arranged in the second direction (X-direction). The first drain side channel layer D_CH1 and the second drain side channel layer D_CH2, which are alternately arranged in the first direction (Y-direction) may be connected to the different bit lines BL.

According to the aforementioned structures, a pipe transistor is formed at a crossing portion of the pipe gate PG and the first channel layer CH1 or a crossing portion of the pipe gate PG and the second channel layer CH2. The memory cells are formed at crossing portions of the word lines D_WL and S_WL and the first channel layer CH1 or crossing portions of the word lines D_WL and S_WL and the second channel layer CH2. A source select transistor is formed at a crossing portion of the source select line SSL and the first channel layer CH1 or a crossing portion of the source select line SSL and the second channel layer CH2. A drain select transistor is formed at a crossing portion of the drain select line DSL and the first channel layer CH1 or a crossing portion of the drain select line DSL and the second channel layer CH2. Accordingly, a first memory string including the drain select transistor, the memory cells, the pipe transistor, and the source select transistor, which are serially connected by the first channel layer CH1, is connected between one bit line BL and the source line SL. Further, a second memory string including the drain select transistor, the memory cells, the pipe transistor, and the source select transistor serially connected by the second channel layer CH2 is connected between one bit line BL and the source line SL. The first memory string and the second memory string may be densely disposed according to the disposition of the first pipe channel layer P_CH1 and the second pipe channel layer P_CH2, so that in an embodiment of the present disclosure, it may be possible to improve an integration degree of the memory device in a limited area. Although not illustrated in the drawing, a structure, in which the second memory string formed along the second channel layer CH2, may also be included in the scope of the present disclosure. For convenience of description, the present disclosure has been described based on the structure including the first and second memory strings as an example, but the present disclosure is not limited thereto.

Figure 2A:
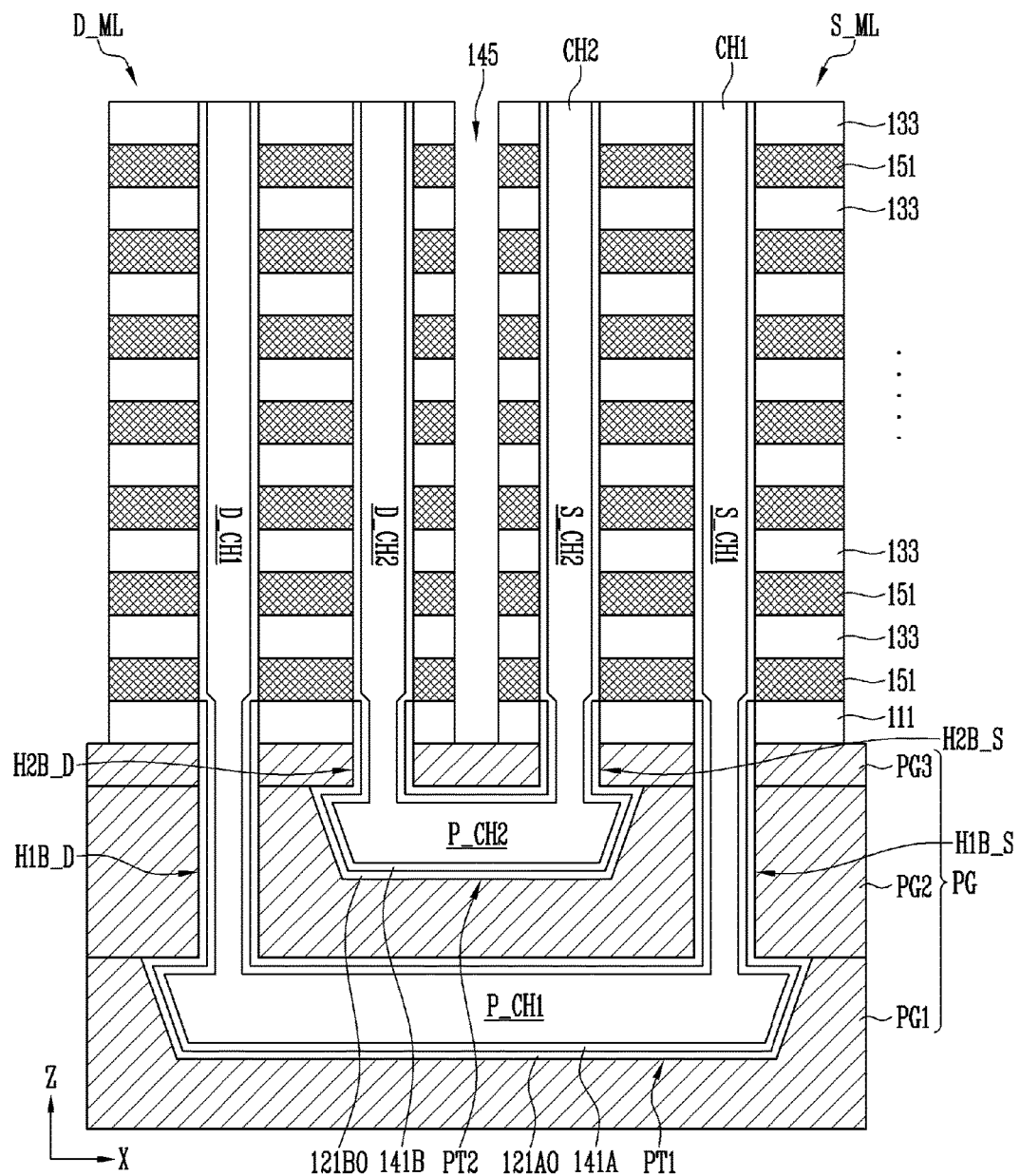

FIGS. 2A and 2B are cross-sectional views illustrating representations of examples of semiconductor devices according to various embodiments. For example, FIGS. 2A and 2B are cross-sectional views of a 3D memory device. FIGS. 2A and 2B are diagrams for describing a region, in which an oxidization layer surrounding a pipe channel layer is formed, and a region, in which a memory layer or memory patterns surrounding the channel layer, is formed. In FIGS. 2A and 2B, a region, in which the second memory string is disposed, is projected and illustrated for convenience of description.

Referring to FIGS. 2A and 2B, the 3D memory device according to examples of the embodiments of the present disclosure include memory cells which are three-dimensionally arranged along the channel layer CH1 or CH2. The channel layer CH1 or CH2 includes the pipe channel layer P_CH1 or P_CH2, and the source side channel layer S_CH1 or S_CH2 and the drain side channel layer D_CH1 or D_CH2 extended from the pipe channel layer P_CH1 or P_CH2 to protrude from the upper portion of the pipe channel layer P_CH1 or P_CH2.

The pipe channel layer P_CH1 or P_CH2 is surrounded by the pipe gate PG. A first insulating layer 111 may be formed to be in contact with an upper portion of the pipe gate PG. Conductive patterns 151 and second insulating layers 133 are alternately stacked on the first insulating layer 111. The first insulating layer 111 may be formed of the same material as that of the second insulating layers 133. For example, the first insulating layer 111 and the second insulating layers 133 may be formed of silicon oxide layers. The second insulating layers 133 and the conductive patterns 151 may be passed through by the slit 145 disposed between the source side channel layer S_CH1 or S_CH2 and the drain side channel layer D_CH1 or D_CH2 to be separated into the source side stack body S_ML and the drain side stack body D_ML. The source side stack body S_ML is formed to surround the source side channel layer S_CH1 or S_CH2, and the drain side stack body D_ML is formed to surround the drain side channel layer D_CH1 or D_CH2. The slit 145 may be extended to pass through the first insulating layer 111.

The pipe channel layer P_CH1 or P_CH2 may include an upper end extended toward the source side channel layer S_CH1 or S_CH2 and the drain side channel layer D_CH1 or D_CH2 and passing through the first insulating layer 111. In this example, the upper end of the pipe channel layer P_CH1 or P_CH2 may protrude past the pipe gate PG.

An oxidization layer 121AO or 121BO is disposed between the pipe gate PG and the pipe channel layer P_CH1 or P_CH2. The oxidization layer 121AO or 121BO may serve as a gate insulating layer of the pipe transistor. The oxidization layer 121AO or 121BO may include an upper end extended while passing through the first insulating layer 111 to surround the upper end of the pipe channel layer P_CH1 or P_CH2. In this example, the upper end of the oxidization layer 121AO or 121BO may further protrude than the pipe gate PG. The oxidization layer 121AO or 121BO is cut at a lower portion of the source side stack body S_ML and the drain side stack body D_ML so as not to surround the source side channel layer S_CH1 or S_CH2 and the drain side channel layer D_CH1 or D_CH2. According to the structure, the source side channel layer S_CH1 or S_CH2 and the drain side channel layer D_CH1 or D_CH2 further protrude than the oxidization layer 121AO or 121BO. In an embodiment, the source side channel layer S_CH1 or S_CH2 and the drain side channel layer D_CH1 or D_CH2 further protrude than the oxidization layer 121AO or 121BO protruding beyond the pipe gate PG.

An external wall of the channel layer CH1 or CH2 may be surrounded by a memory layer 141A or 141B as illustrated in FIG. 2A, or surrounded by memory patterns 161P formed along surfaces of the conductive patterns 151, respectively, as illustrated in FIG. 2B. The memory layer 141A or 141B and the memory patterns 161P may be formed of a material capable of storing data, for example, silicon, a nitride, a phase change material, and nanodot.

Referring to FIG. 2A, the memory layer 141A or 141B may be extended from a space between the oxidization layer 121AO or 121BO and the pipe channel layer P_CH1 or P_CH2. The memory layer 141A or 141B may be extended to surround external walls of the source side channel layer S_CH1 or S_CH2 and the drain side channel layer D_CH1 or D_CH2. Although not illustrated in the drawing, an external wall of the memory layer 141A or 141B may be surrounded by the charge blocking layer, and the tunnel insulating layer may be disposed between the memory layer 141A or 141B and the channel layer CH1 or CH2.

Referring to FIG. 2B, the memory patterns 161P may be separated by the slit 145. Lateral walls or side walls of the conductive patterns 151 adjacent to the slit 145 may not be covered by the memory patterns 161P. Although not illustrated in the drawing, the charge blocking layers may be disposed between the memory patterns 161P and the conductive patterns 151, and the tunnel insulating layer may be disposed between each of the memory patterns 161P and the channel layer CH1 or CH2. Each of the charge blocking layers may be formed along a form of each of the memory patterns 161P. The tunnel insulating layer may be formed to surround the external wall of the channel layer CH1 or CH2 along the form of the channel layer CH1 or CH2, or formed along a form of each of the memory patterns 161P.

The pipe gate PG may include a first pipe gate PG1 having a first concave portion PT1, a second pipe gate PG2 on the first pipe gate PG1 and having a second concave portion PT2, and a third pipe gate PG3 formed on the second pipe gate PG2. The first to third pipe gates PG1 to PG3 may be formed of the same conductive material, for example, polysilicon. The second concave portion PT2 may overlap the first concave portion PT1 or partially overlap the first concave portion PT1. The second concave portion PT2 may be formed with a smaller width than that of the first concave portion PT1. Both ends of the first concave portion PT1 may protrude past or beyond both sides of the second concave portion PT2.

The first insulating layer 111, the third pipe gate PG3, and the second pipe gate PG2 may be passed through by a first source side pipe through-hole H1B_S and a first drain side pipe through-hole H1B_D. The first source side pipe through-hole H1B_S and the first drain side pipe through-hole H1B_D are connected to both ends of the first concave portion PT1 exposed and protruding beyond or past both sides of the second concave portion PT2.

The first insulating layer 111 and the third pipe gate PG3 may be passed through by a second source side pipe through-hole H2B_S and a second drain side pipe through-hole H2B_D. The second source side pipe through-hole H2B_S and the second drain side pipe through-hole H2B_D are connected to both ends of the second concave portion PT2.

The pipe channel layer may include the first pipe channel layer P_CH1 formed along a region defined by the first concave portion PT1, the first source side pipe through-hole H1B_S, and the first drain side pipe through-hole H1B_D. The pipe channel layer may further include the second pipe channel layer P_CH2 overlapping the first pipe channel layer P_CH1. The first pipe channel layer P_CH1 may be formed inside the first concave portion PT1, the first source side pipe through-hole H1B_S, and the first drain side pipe through-hole H1B_D along shapes of the first concave portion PT1, the first source side pipe through-hole H1B_S, and the first drain side pipe through-hole H1B_D. The second pipe channel layer P_CH2 may be formed inside the second concave portion PT2, the second source side pipe through-hole H2B_S, and the second drain side pipe through-hole H2B_D along shapes of the second concave portion PT2, the second source side pipe through-hole H2B_S, and the second drain side pipe through-hole H2B_D. The second pipe channel layer P_CH2 may overlap the first pipe channel layer P_CH1 or partially overlap first pipe channel layer P_CH1. The second pipe channel layer P_CH2 may be formed with a smaller width than that of the first pipe channel layer P_CH1.

The oxidization layer may include the first oxidization layer 121AO formed along the surface of the first pipe channel layer P_CH1. The oxidization layer may further include the second oxidization layer 121BO formed along the surface of the second pipe channel layer P_CH2. The first and second oxidization layers 121AO and 121BO may be cut at a height of an upper surface of the first insulating layer 111 so as not to further protrude than the first insulating layer 111.

The source side channel layer and the drain side channel layer may include the first source side channel layer S_CH1 and the first drain side channel layer D_CH1 extended from the first pipe channel layer P_CH1 to further protrude than the first insulating layer 111 and the first oxidization layer 121AO. The source side channel layer and the drain side channel layer may include the second source side channel layer S_CH2 and the second drain side channel layer D_CH2 extended from the second pipe channel layer P_CH2 to further protrude than the first insulating layer 111 and the second oxidization layer 121BO. The second source side channel layer S_CH2 and the second drain side channel layer D_CH2 may be disposed between the first source side channel layer S_CH1 and the first drain side channel layer D_CH1. The first and second source side channel layer S_CH1 and S_CH2, which are adjacent to each other, may be commonly surrounded by the source side stack body S_ML. The first and second drain side channel layer D_CH1 and D_CH2, which are adjacent to each other, may be commonly surrounded by the drain side stack body D_ML.

The memory layer may include the first memory layer 141A surrounding the first source side channel layer S_CH1 and the first drain side channel layer D_CH1, and extended to a space between the first oxidization layer 121AO and the first pipe channel layer P_CH1 as illustrated, for example, in FIG. 2A. The memory layer may further include the second memory layer 141B surrounding the second source side channel layer S_CH2 and the second drain side channel layer D_CH2, and extended to a space between the second oxidization layer 121BO and the second pipe channel layer P_CH2.

FIGS. 3A to 3I are cross-sectional views illustrating representations of examples for describing a method of manufacturing the semiconductor device according to an embodiment illustrated in FIG. 2A. In FIGS. 3A to 3I, a region, in which the second memory string is disposed, is projected and illustrated for convenience of description.

Figure 3A:
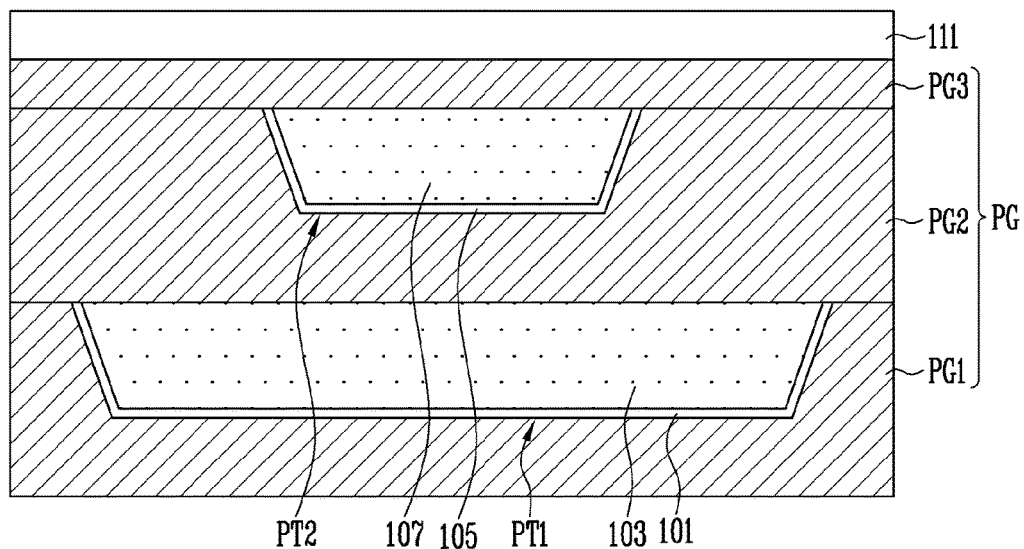

Referring to FIG. 3A, the pipe gate PG having a structure closing a buried layer 103 or 107 is formed. The buried layer 103 or 107 may be formed of a material, which is difficult to be oxidized and is easily removed by a cleaning process, and the like, compared to a gap fill layer formed in a subsequent process. The buried layer 103 or 107 may be formed of a material having large tolerance to a wet etching process of the pipe gate PG. For example, the buried layer 103 or 107 may have larger tolerance to a wet etching process of the pipe gate PG compared to a gap fill layer formed in a subsequent process. The buried layer 103 or 107 is removed before sacrificial layers and second insulating layers are stacked. Therefore, a chemical property of the buried layer 103 or 107 may be selected without considering etch selectivity for the sacrificial layers and the second insulating layers. Accordingly, the buried layer 103 or 107 may be formed of the same material or substantially the same material as those of the sacrificial layers. The buried layer 103 or 107 may be formed of a different material from that of the pipe gate PG so as to have etch selectivity for the pipe gate PG. For example, the buried layer 103 or 107 may be formed of a nitride layer.

An example of a process of forming the pipe gate PG having a structure closing or surrounding the buried layer 103 or 107 will be described below.

First, the first concave portion PT1 may be formed on a surface of the first pipe gate PG1 by etching a part of the first pipe gate PG1. The first pipe gate PG1 is formed of a conductive material, such as polysilicon. Next, the first buried layer 103 may be filled inside the first concave portion PT1. To this end, a process of forming the first buried layer 103 having a thickness, with which the first concave portion PT1 is completely filled, on a surface of the first pipe gate PG1 having the first concave portion PT1, and a process of planarizing a surface of the first buried layer 103 so as to expose the surface of the first pipe gate PG1 may be sequentially performed. Before the first buried layer 103 is formed, a first buffer layer 101 may be further formed along the surface of the first pipe gate PG1 having the first concave portion PT1. The first buffer layer 101 may be an oxide layer.

Next, the second pipe gate PG2 may be formed on the first pipe gate PG1 having the first concave portion PT1 filled with the first buried layer 103. The second pipe gate PG2 is formed of a conductive material, such as polysilicon. Then, the second concave portion PT2 overlapping the first concave portion P1 may be formed by etching a part of the second pipe gate PG2. Next, the second buried layer 107 may be filled inside the second concave portion PT2. To this end, a process of forming the second buried layer 107 having a thickness, with which the second concave portion PT2 is completely filled, on a surface of the second pipe gate PG2 having the second concave portion PT2, and a process of planarizing a surface of the second buried layer 107 so that the surface of the second pipe gate PG2 may be exposed may be sequentially performed. Before the second buried layer 107 is formed, a second buffer layer 105 may be further formed along the surface of the second pipe gate PG2 having the second concave portion PT2. The second buffer layer 105 may be an oxide layer.

Next, the third pipe gate PG3 may be formed on the second pipe gate PG2 having the second concave portion PT2 filled with the second buried layer 107. The third pipe gate PG3 may be formed of a conductive material, such as polysilicon.

Through the aforementioned process, the first and second buried layer 103 and 107 are closed or surrounded, and the pipe gate PG having the structure, in which the first to third pipe gates PG1 to PG3 are stacked, may be formed.

The first insulating layer 111 may be formed on the pipe gate PG. The first insulating layer 111 may be formed of a material usable as a planarization stop layer in a subsequent process of planarizing the gap fill layer. For example, the first insulating layer 111 may be the same material layer as those of the second insulating layers, for example, an oxide layer, formed in a subsequent process.

Figure 3B:
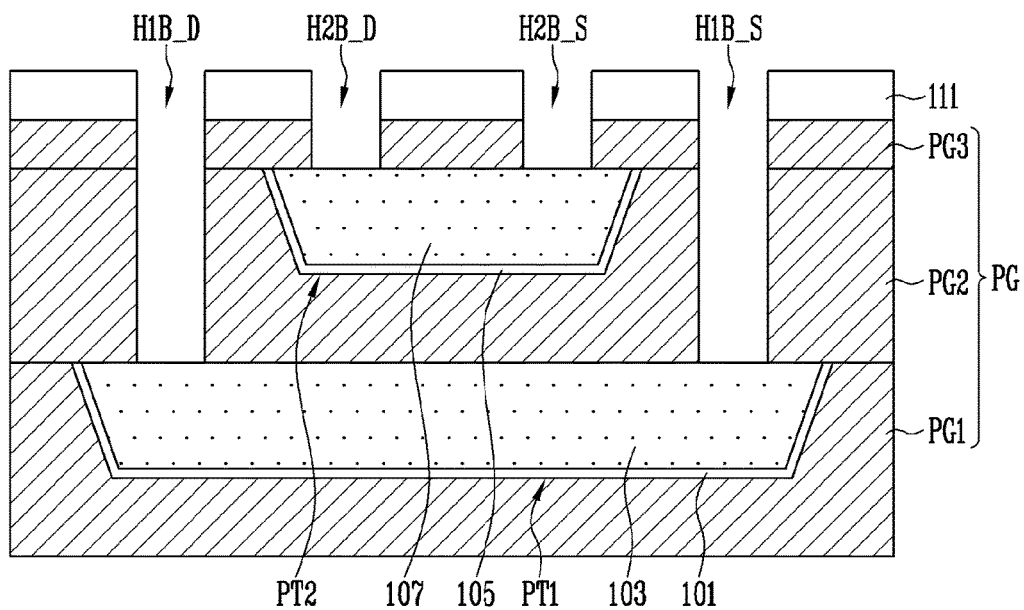

Referring to FIG. 3B, the source side pipe through-hole H1B_S or H2B_S and the drain side pipe through-hole H1B_D or H2B_D may be formed by etching a part of the pipe gate PG so that the buried layer 103 or 107 is exposed. An example of the process of forming the source side pipe through-hole H1B_S or H2B_S and the drain side pipe through-hole H1B_D or H2B_D will be described below.

Parts of the first buried layer 103 and the second buried layer 107 are exposed by etching at least one of the first insulating layer 111, the third pipe gate PG3 and the second pipe gate PG2 by a first etching process. The first buried layer 103 is exposed by the first source side pipe through-hole H1B_S and the first drain side pipe through-hole H1B_D passing through the first insulating layer 111, the third pipe gate PG3, and the second pipe gate PG2. The second buried layer 107 is exposed by the second source side pipe through-hole H2B_S and the second drain side pipe through-hole H2B_D passing through the first insulating layer 111 and the third pipe gate PG3. The first etching process may be performed by a dry etching method advantageous to form a narrow and deep structure. For example, the first etching process may be performed by using ions having a straight property and the like.

The second source side pipe through-hole H2B_S and the second drain side pipe through-hole H2B_D defined by the first etching process may be controlled to have a smaller width than a target width. Accordingly, it is possible to decrease a defect in that a width of each of the second source side pipe through-hole H2B_S and the second drain side pipe through-hole H2B_D is deviated from the region, in which the second concave portion PT2 is disposed, to be connected with the first concave portion PT1.

Next, widths of the first pipe through-hole H1B_S, the drain side first pipe through-hole H1B_D, the source side second pipe through-hole H2B_S, and the drain side second pipe through-hole H2B_D are increased by a second etching process. The second etching process may be performed by a wet etching method advantageous to increase the width. Through the second etching process, each of the second source side pipe through-hole H2B_S and the second drain side pipe through-hole H2B_D may be formed with a target width. Even though the wet etching process is performed in a state where the first and second buried layers 103 and 107 are exposed, the first and second buried layers 103 and 107 are formed of a material, such as a nitride layer, having large tolerance to the wet etching process, so that it is possible to decrease a phenomenon that the first and second buried layers 103 and 107 are lost during the wet etching process.

For example, when the first and second buried layers 103 and 107 include a metal, identically to the gap fill layer formed in the subsequent process (for example, when the first and second buried layers 103 and 107 are formed of TiN), the amount of loss of the first and second buried layers 103 and 107 may be large during the wet etching process. In an example of an embodiment of the present disclosure, chemical properties of the first and second buried layers 103 and 107 are selected by considering tolerance to the wet etching process, so that it is possible to decrease the amount of loss of the first and second buried layers 103 and 107 during the wet etching process.

Figure 3C:
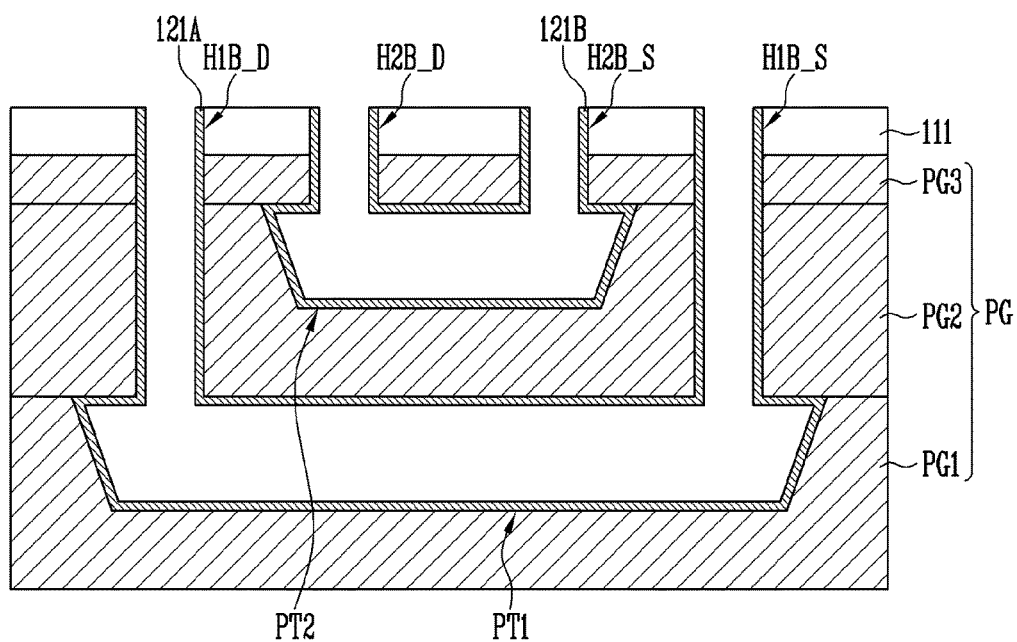

Referring to FIG. 3C, the first and second buried layers 103 and 107 are removed through the source side pipe through-hole H1B_S or H2B_S and the drain side pipe through-hole H1B_D or H2B_D. The buffer layer 101 or 105 (see FIG. 3B) may be removed while the first and second buried layers 103 and 107 are removed. Accordingly, the source side pipe through-hole H1B_S or H2B_S, the drain side pipe through-hole H1B_D or H2B_D, and the concave portion PT1 or PT2 are completely opened.

Subsequently, a passivation layer 121A or 121B is formed along surfaces of the source side pipe through-hole H1B_S or H2B_S, the drain side pipe through-hole H1B_D or H2B_D, and the concave portion PT1 or PT2. The passivation layer 121A or 121B is formed in order to protect the pipe gate PG from a subsequent oxidization process, and may be formed of a nitride layer.

The passivation layer may include the first passivation layer 121A formed along surfaces of the first concave portion PT1, the first source side pipe through-hole H1B_S, and the first drain side pipe through-hole H1B_D. The passivation layer may include the second passivation layer 121B formed along surfaces of the second concave portion PT2, the second source side pipe through-hole H2B_S, and the second drain side pipe through-hole H2B_D.

Figure 3D:
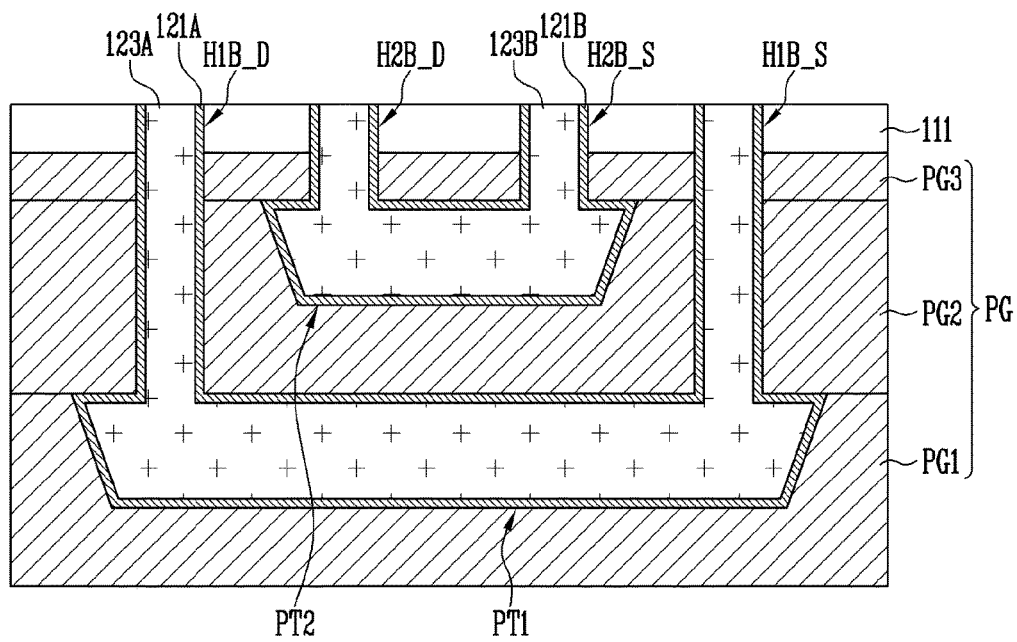

Referring to FIG. 3D, a gap fill layer 123A or 123B filled in the source side pipe through-hole H1B_S or H2B_S, the drain side pipe through-hole H1B_D or H2B_D, and the concave portion PT1 or PT2 is formed on the passivation layer 121A or 121B. The gap fill layer 123A or 123B may be formed of a different material from those of the second insulating layers and the sacrificial layers having etch selectivity for the second insulating layers and the sacrificial layers formed in a subsequent process. For example, the gap fill layer 123A or 123B may include a metal. For example, the gap fill layer 123A or 123B may include W or TiN.

The gap fill layer may include the first gap fill layer 123A filled in the first concave portion PT1, the first source side pipe through-hole H1B_S, and the first drain side pipe through-hole H1B_D on the first passivation layer 121A. The gap fill layer may include the second gap fill layer 123B filled in the second concave portion PT2, the second source side pipe through-hole H2B_S, and the second drain side pipe through-hole H2B_D on the second passivation layer 121B. In order to form the gap fill layer 123A or 123B, a planarizing process, such as Chemical Mechanical Polishing (CMP), using the first insulating layer 111 as a planarization stop layer may be performed.

By performing the process described with reference to FIGS. 3A to 3D, a lower structure including the pipe gate PG surrounding the gap fill layer 123A or 123B and the passivation layer 121A or 121B disposed between the pipe gate PG and the gap fill layer 123A or 123b may be formed. The lower structure may further include the first insulating layer 111 disposed on the pipe gate PG and passed through by the gap fill layer 123A or 123B. In this case, the passivation layer 121A or 121B is extended to a space between the first insulating layer 111 and the gap fill layer 123A or 123B.

Referring to FIG. 3E, sacrificial layers 131 and the second insulating layers 133 are alternately stacked on the lower structure. The sacrificial layers 131 are formed of a different material from that of the second insulating layers 133 so as to have etch selectivity for the second insulating layers 133. The sacrificial layers 131 and the second insulating layers 133 may be formed of an insulating material so as to secure etching easiness during the etching process for forming a source side through-hole H1T_S or H2T_2 and a drain side through-hole H1T_D or H2T_D. For example, the sacrificial layers 111 may be formed of nitride layers, and the second insulating layers 133 may be formed of silicon oxide layers. The lowermost layer among the sacrificial layers 131 is formed to be in contact with the gap fill layer 123A or 123B. Accordingly, it is possible to prevent a phenomenon that the gap fill layer 123A or 123B reacts to the second insulating layers 133, so that a part of the gap fill layer 123A or 123B is damaged, while the second insulating layers 133 are formed. Before the sacrificial layers 131 are formed, the first insulating layer 111 having the same chemical property as that of the second insulating layers 133 has been formed, the sacrificial layers 131 may be prevented from being in contact with the pipe gate PG.

Subsequently, the source side through-hole H1T_S or H2T_S and the drain side through-hole H1T_D or H2T_D, through which the gap fill layer 123A or 123B is exposed, are formed by etching the sacrificial layers 131 and the second insulating layers 133. The source side through-hole may include the first source side through-hole H1T_S exposing the first gap fill layer 123A. The source side through-hole may further include the second source side through-hole H2T_S exposing the second gap fill layer 123B. The first source side through-hole H1T_S is connected to the first source side pipe through-hole H1B_S, and the second source side through-hole H2T_S is connected to the second source side pipe through-hole H2B_S. The source side through-hole may include the first source side through-hole H1T_S exposing the first gap fill layer 123A. The drain side through-hole may include the first drain side through-hole H1T_D exposing the first gap fill layer 123A. The drain side through-hole may further include the second drain side through-hole H2T_D exposing the second gap fill layer 123B. The first drain side through-hole H1T_D is connected to the first drain side pipe through-hole H1B_D, and the second drain side through-hole H2T_D is connected to the second drain side pipe through-hole H2B_D.

As described above, in an example of an embodiment, the source side pipe through-hole H1B_S or H2B_S and the drain side pipe through-hole H1B_D or H2B_D passing through the pipe gate PG are formed, the sacrificial layers 131 and the second insulating layers 133 are stacked, and then the source side through-hole H1T_S or H2T_S and the drain side through-hole H1T_D or H2T_D arranged on the source side pipe through-hole H1B_S or H2B_S and the drain side pipe through-hole H1B_D or H2B_D while passing through the sacrificial layers 131 and the second insulating layers 133 are formed. In an example of an embodiment of the present disclosure, the process may have an advantage through the process order.

In an example of an embodiment, before the source side through-hole H1T_S or H2T_S and the drain side through-hole H1T_D or H2T_D are formed, the source side pipe through-hole H1B_S or H2B_S and the drain side pipe through-hole H1B_D or H2B_D are formed by etching the pipe gate PG. Accordingly, in an example of an embodiment of the present disclosure, the source side pipe through-hole H1B_S or H2B_S and the drain side pipe through-hole H1B_D or H2B_D may be formed with sufficiently large widths.

Differently from the embodiments of the present disclosure, when the source side pipe through-hole H1B_S or H2B_S and the drain side pipe through-hole H1B_D or H2B_D are formed by etching the pipe gate PG through the source side through-hole H1T_S or H2T_S and the drain side through-hole H1T_D or H2T_D, the pipe gate PG may not be etched. As a result, the source side pipe through-hole H1B_S or H2B_S and the drain side pipe through-hole H1B_D or H2B_D may not be opened. When the pipe gate PG is excessively etched in order to improve the problem, there may be a bowing phenomenon, in which concave curved surfaces are formed on lateral walls of the source side pipe through-hole H1B_S or H2B_S and the drain side pipe through-hole H1B_D or H2B_D.

In an example of an embodiment of the present disclosure, it may be possible to prevent a phenomenon, such as the bowing phenomenon, in which a structure of the pipe gate PG is distorted, by forming the source side pipe through-hole H1B_S or H2B_S and the drain side pipe through-hole H1B_D or H2B_D by etching the pipe gate PG before the source side through-hole H1T_S or H2T_S and the drain side through-hole H1T_D or H2T_D.

In an example of an embodiment of the present disclosure, an etching thickness of the pipe gate PG does not need to be considered during the etching process for forming the source side through-hole H1T_S or H2T_S and the drain side through-hole H1T_D or H2T_D. Accordingly, in an example of an embodiment of the present disclosure, it is possible to decrease a thickness of an etching mask (not illustrated) used in the etching process for forming the source side through-hole H1T_S or H2T_S and the drain side through-hole H1T_D or H2T_D.

In an example of an embodiment of the present disclosure, after the source side through-hole H1T_S or H2T_S and the drain side through-hole H1T_D or H2T_D are formed, the pipe gate PG may not be etched through the source side through-hole H1T_S or H2T_S and the drain side through-hole H1T_D or H2T_D. Accordingly, in an example of an embodiment of the present disclosure, it may be possible to fundamentally prevent a phenomenon in that the widths of the source side through-hole H1T_S or H2T_S and the drain side through-hole H1T_D or H2T_D are increased during the etching the pipe gate PG. As a result, it is possible to secure an etching margin of the source side through-hole H1T_S or H2T_S and the drain side through-hole H1T_D or H2T_D.

Figure 3F:
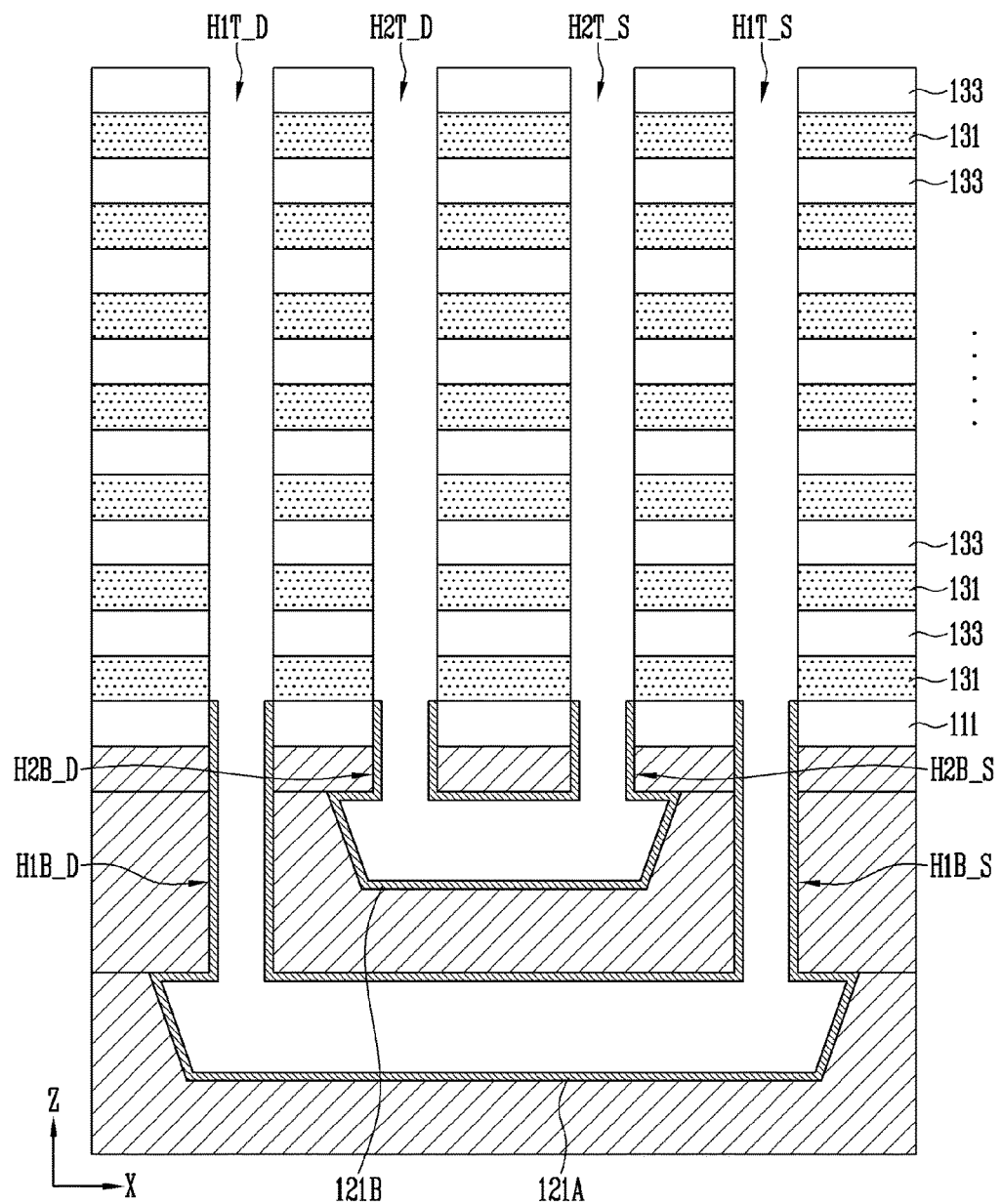

Referring to FIG. 3F, the passivation layer 121A or 121B is exposed by removing the gap fill layer 123A or 123B through the source side through-hole H1T_S or H2T_S and the drain side through-hole H1T_D or H2T_D.

Figure 3G:
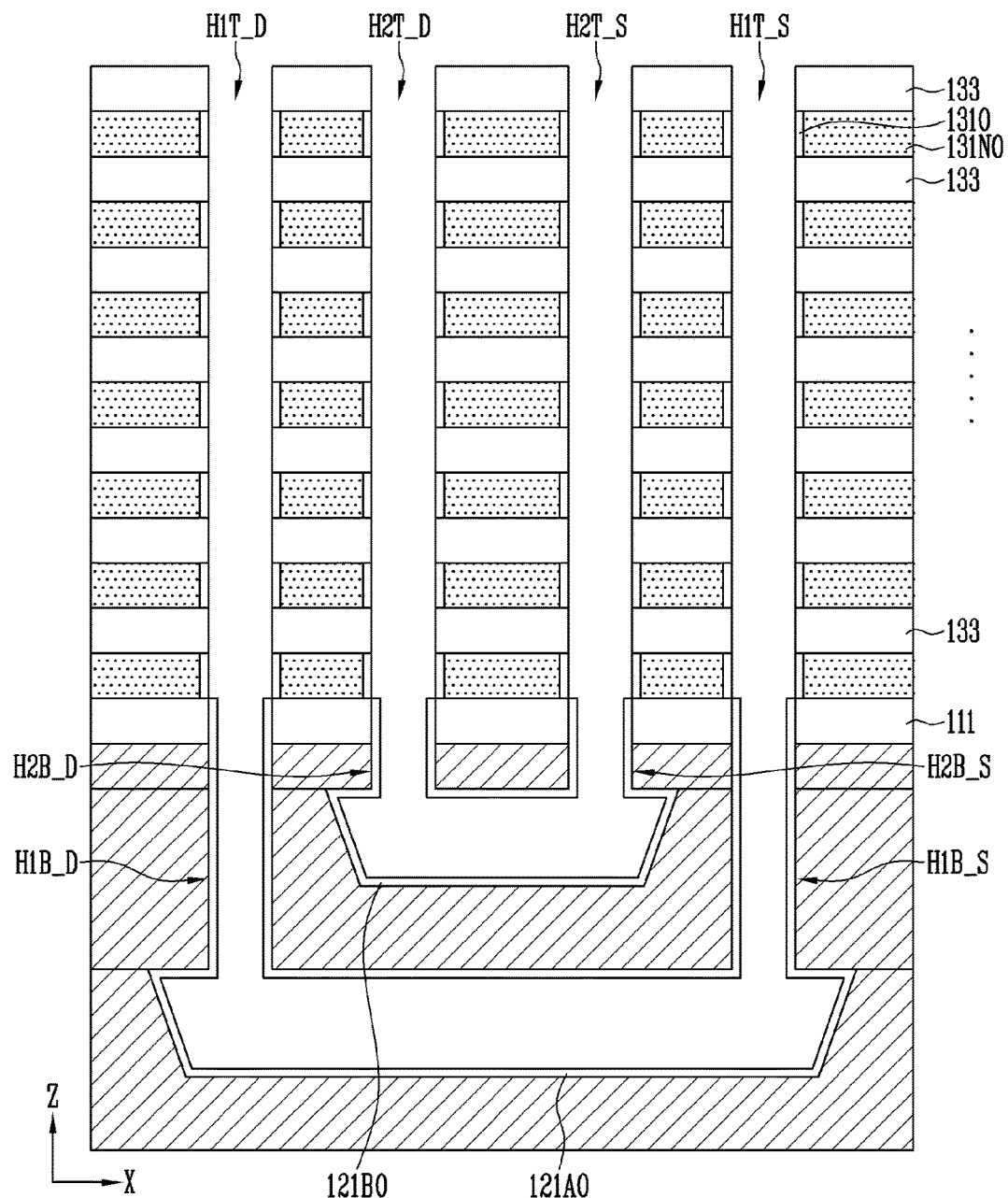

Referring to FIG. 3G, lateral walls of the passivation layer 121A or 121B and the sacrificial layers 131 are oxidized by an oxidization process. Accordingly, the passivation layer 121A or 121B may be changed to the oxidization layer 121AO or 121BO serving as the gate insulating layer. Further, the lateral walls of the sacrificial layers 131 exposed through the source side through-hole H1T_S or H2T_S and the drain side through-hole H1T_D or H2T_D are changed to sacrificial oxidization regions 131O. Hereinafter, regions of the sacrificial layers 131, which are not oxidized and left, are defined as non-oxidization regions 131NO.

The oxidization layer may include a first oxidization layer 121AO which is the oxidized first passivation layer 121A. The oxidization layer may further include a second oxidization layer 121BO which is the oxidized second passivation layer 121B. That is, the oxidization layer 121AO or 121BO is an oxidization region of the passivation layer 121A or 121B.

Differently from the embodiments of the present disclosure, when the passivation layer 121A or 121B is not formed, a part of the pipe gate PG may be oxidized in the process of oxidizing the sacrificial layers 131. When the pipe gate PG is oxidized, resistance of the pipe gate PG may be increased due to a loss of volume of the pipe gate PG. Further, the oxidization layer may be excessively thickly formed due to excessive expansion of volume while the pipe gate PG is oxidized. As a result, the widths of the source side pipe through-hole H1B_S or H2B_S and the drain side pipe through-hole H1B_D or H2B_D may be decreased.

In an example of an embodiment of the present disclosure, the oxidization layer 121AO or 121BO is formed by oxidizing the passivation layer 121A or 121B without oxidizing the pipe gate PG, so that it may be possible to prevent a phenomenon, in which the thickness of the oxidization layer 121AO or 121BO is excessively increased.

Figure 3H:
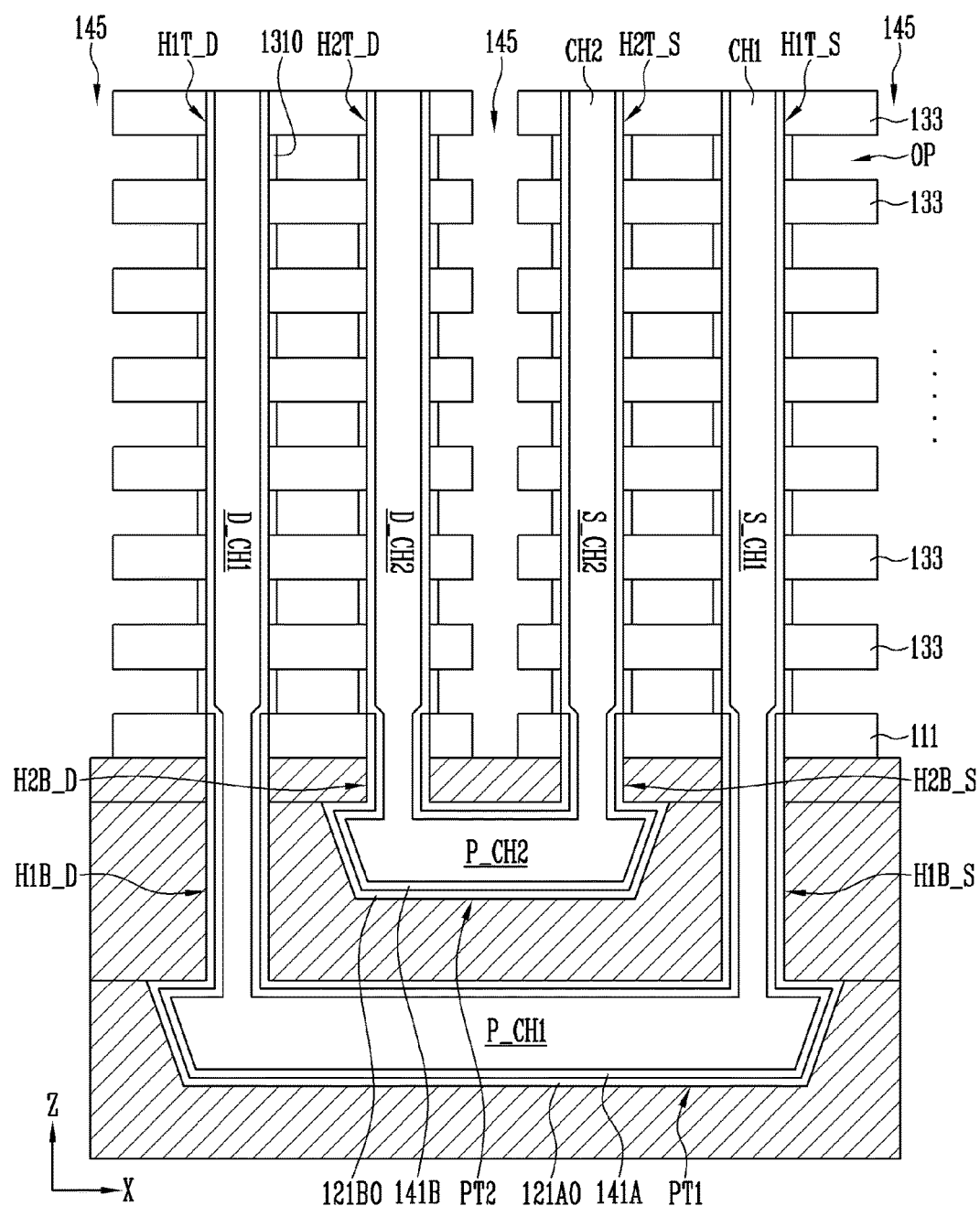

Referring to FIG. 3H, the memory layer 141A or 141B is formed along the surfaces of the source side through-hole H1T_S or H2T_S, the source side pipe through-hole H1B_S or H2B_S, the concave portion PT1 or PT2, the drain side pipe through-hole H1B_D or H2B_D, and the drain side through-hole H1T_D or H2T_D. The memory layer includes the first memory layer 141A formed along the surfaces of the first source side through-hole H1T_S, the first source side pipe through-hole H1B_S, the first concave portion PT1, the first drain side pipe through-hole H1B_D, and the first drain side through-hole H1T_D. The first memory layer 141A is disposed on the first oxidization layer 121AO within the first concave portion PT1, and is formed along the surface of the first oxidization layer 121AO. The memory layer includes the second memory layer 141B formed along the surfaces of the second source side through-hole H2T_S, the second source side pipe through-hole H2B_S, the second concave portion PT2, the second drain side pipe through-hole H2B_D, and the second drain side through-hole H2T_D. The second memory layer 141B is disposed on the second oxidization layer 121BO within the second concave portion PT2, and is formed along the surface of the second oxidization layer 121BO.

Although not illustrated in the drawing, the charge blocking layer may be further formed before the memory layer 141A or 141B is formed.

After the memory layer 141A or 141B is formed, the channel layer CH1 or CH2 filled inside the source side through-hole H1T_S or H2T_S, the source side pipe through-hole H1B_S or H2B_S, the concave portion PT1 or PT2, the drain side pipe through-hole H1B_D or H2B_D, and the drain side through-hole H1T_D or H2T_D is formed. The channel layer CH1 or CH2 may be formed of a semiconductor layer, such as silicon. Although not illustrated in the drawing, before the channel layer CH1 or CH2 is formed, the tunnel insulating layer, such as a silicon oxide layer, may be further formed along the surface of the memory layer 141A or 141B.

The channel layer CH1 or CH2 may be surrounded by the oxidization layer 121AO or 121BO and the sacrificial oxidization regions 131O. The channel layer includes the first channel layer CH1 disposed inside the first source side through-hole H1T_S, the first source side pipe through-hole H1B_S, the first concave portion PT1, the first drain side pipe through-hole H1B_D, and the first drain side through-hole H1T_D. The first channel layer CH1 includes the first source side channel layer S_CH1, the first pipe channel layer P_CH1, and the first drain side channel layer D_CH1. The first source side channel layer S_CH1 may be disposed inside the first source side through-hole H1T_S, and be surrounded by the sacrificial oxidization regions 131O and the second insulating layers 133. The first pipe channel layer P_CH1 may be disposed inside the first source side pipe through-hole H1B_S, the first concave portion PT1, and the first drain side pipe through-hole H1B_D, and be surrounded by the first oxidization layer 121AO. The first drain side channel layer D_CH1 may be disposed inside the first drain side through-hole H1T_D, and be surrounded by the sacrificial oxidization regions 131O and the second insulating layers 133. The channel layer may further include the second channel layer CH2 disposed inside the second source side through-hole H2T_S, the second source side pipe through-hole H2B_S, the second concave portion PT2, the second drain side pipe through-hole H2B_D, and the second drain side through-hole H2T_D. The second channel layer CH2 includes the second source side channel layer S_CH2, the second pipe channel layer P_CH2, and the second drain side channel layer D_CH2. The second source side channel layer S_CH2 may be disposed inside the second source side through-hole H2T_S, and be surrounded by the sacrificial oxidization regions 131O and the second insulating layers 133. The second pipe channel layer P_CH2 may be disposed inside the second source side pipe through-hole H2B_S, the second concave portion PT2, and the second drain side pipe through-hole H2B_D, and be surrounded by the second oxidization layer 121BO. The second drain side channel layer D_CH2 may be disposed inside the second drain side through-hole H2T_D, and be surrounded by the sacrificial oxidization regions 131O and the second insulating layers 133.

After the channel layer CH1 or CH2 is formed by the aforementioned process, the slit 145 passing through the second insulating layers 133 and the non-oxidization regions 131NO between the source side through-hole H1T_S or H2T_S and the drain side through-hole H1T_D or H2T_D is formed. For example, the slit 145 may be formed by etching the second insulating layers 133 and the non-oxidization regions 131NO between the second source side through-hole H2T_S and the second drain side through-hole H2T_D. The slit 145 may be extended into the first insulating layer 111.

Subsequently, openings OP exposing the oxidization regions 131O are formed by removing the non-oxidization regions 131NO exposed through the slit 145. The openings OP may be defined between the second insulating layers 133, and between the first insulating layer 111 and the lowermost layer adjacent to the first insulating layer 111 among the second insulating layers 133. The oxidization regions 131O may serve as an etching stop layer and protect the memory layer 141A or 141B during the etching process of removing the non-oxidization regions 131NO.

Referring to FIG. 3I, a width of each of the openings OP may be increased by removing the oxidization regions 131O through the slit 145. Next, the conductive patterns 151 filled inside the openings OP are formed.

Figure 4A:
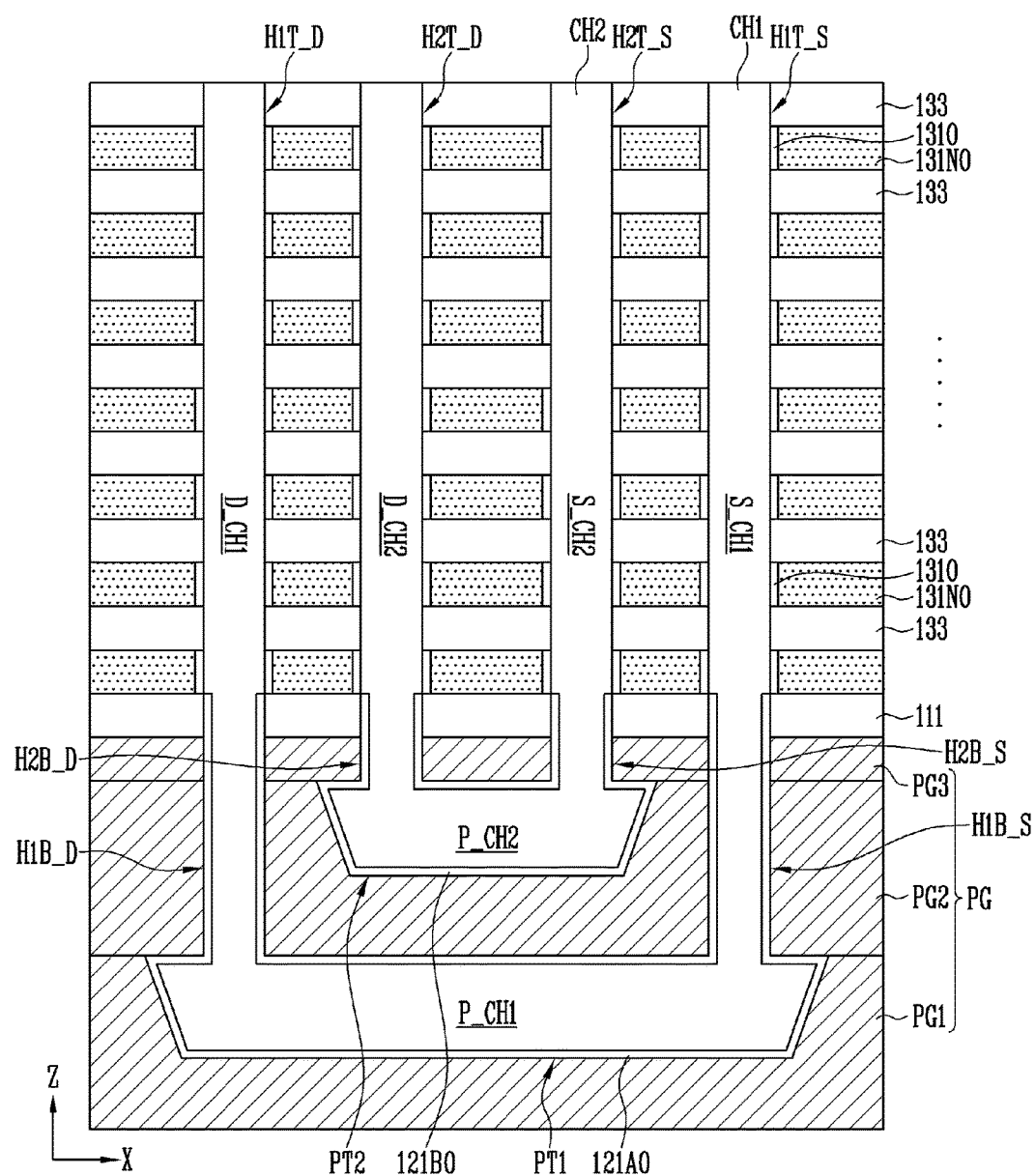
FIGS. 4A to 4C are cross-sectional views illustrating representations of examples for describing a method of manufacturing the semiconductor device according to an embodiment illustrated in FIG. 2B.
Figure 4B:
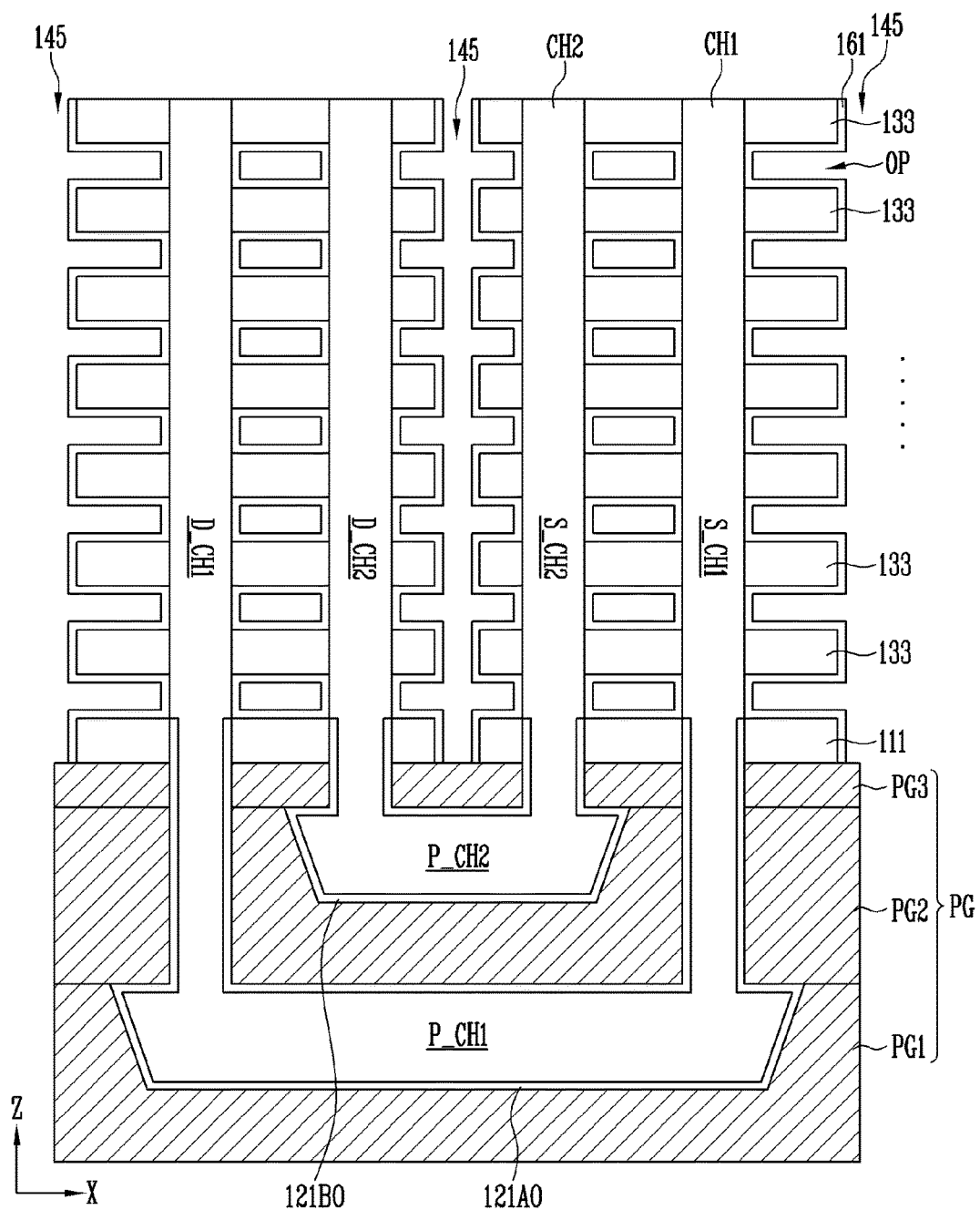
Figure 4C:
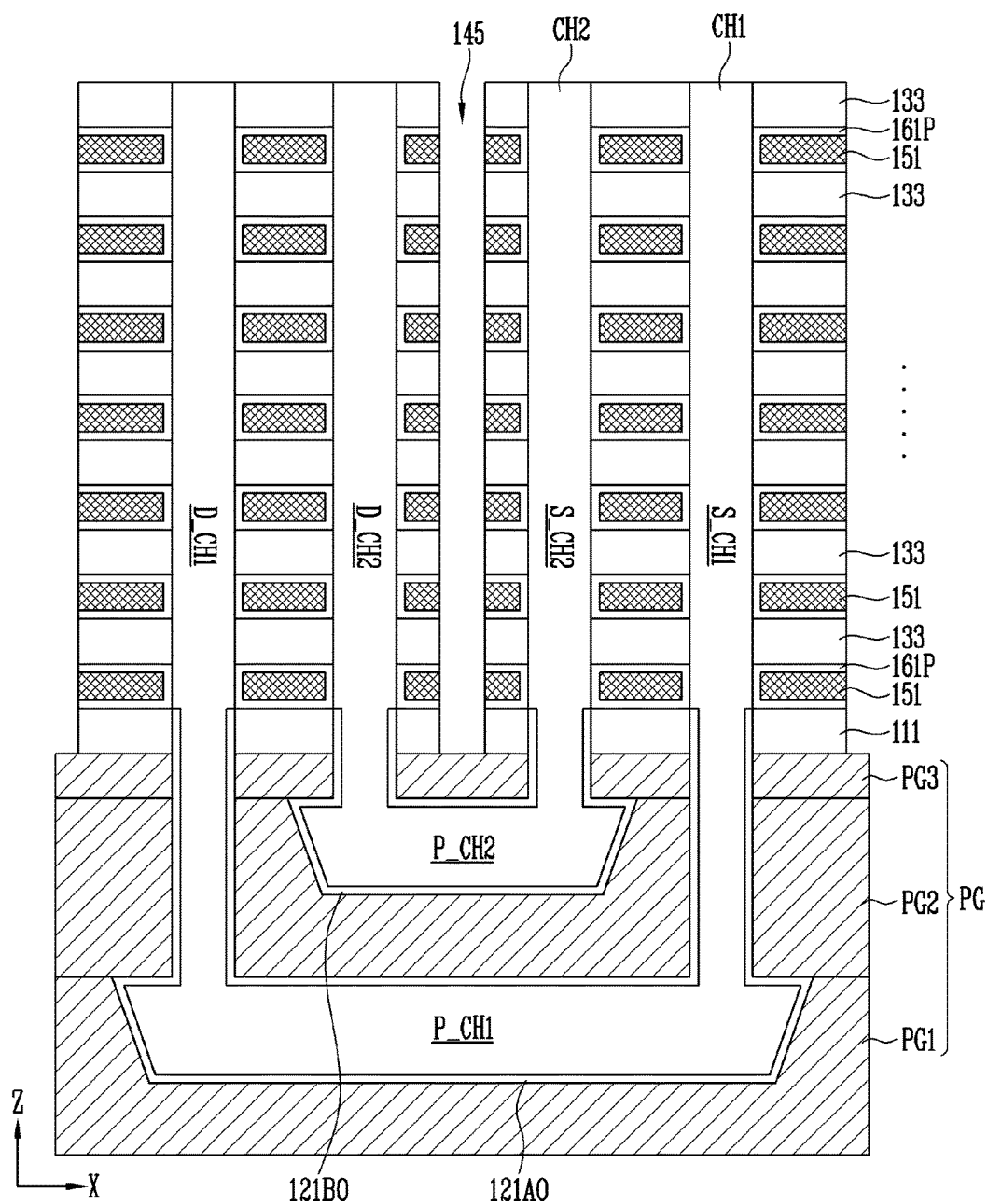

FIGS. 4A to 4C are cross-sectional views illustrating representations of examples for describing a method of manufacturing the semiconductor device according to an example of an embodiment illustrated in FIG. 2B. In FIGS. 4A to 4C, a region, in which the second memory string is disposed, is projected and illustrated for convenience of description.

Referring to FIG. 4A, the pipe gate PG including the first to third pipe gates PG1 to PG3; the first insulating layer 111 that is in contact with an upper portion of the pipe gate PG, the concave portion PT1 or PT2; the source side pipe through-hole H1B_S or H2B_S, the drain side pipe through-hole H1B_D or H2B_D, the second insulating layers 133; sacrificial layers including the non-oxidization regions 131NO and the oxidization regions 131O; the source side through-hole H1T_S or H2T_S; the drain side through-hole H1T_D or H2T_D; and the oxidization layer 121AO or 121BO may be formed by performing the same process as that described with reference to FIGS. 3A to 3G.

Next, the channel layer CH1 or CH2 filled inside the source side through-hole H1T_S or H2T_S, the source side pipe through-hole H1B_S or H2B_S, the concave portion PT1 or PT2, the drain side pipe through-hole H1B_D or H2B_D, and the drain side through-hole H1T_D or H2T_D is formed. The channel layer CH1 or CH2 may be formed of a semiconductor layer, such as silicon.

The channel layer CH1 or CH2 may be surrounded by the oxidization layer 121AO or 121BO and the sacrificial oxidization regions 131O. The channel layer includes the first channel layer CH1 disposed inside the first source side through-hole H1T_S, the source side pipe through-hole H1B_S, the first concave portion PT1, the first drain side pipe through-hole H1B_D, and the first drain side through-hole H1T_D. The first channel layer CH1 includes the first source side channel layer S_CH1, the first pipe channel layer P_CH1, and the first drain side channel layer D_CH1. The first source side channel layer S_CH1 may be disposed inside the first source side through-hole H1T_S, and be surrounded by the sacrificial oxidization regions 131O and the second insulating layers 133. The first pipe channel layer P_CH1 may be disposed inside the first source side pipe through-hole H1B_S, the first concave portion PT1, and the first drain side pipe through-hole H1B_D, and be surrounded by the first oxidization layer 121AO. The first drain side channel layer D_CH1 may be disposed inside the first drain side through-hole H1T_D, and be surrounded by the sacrificial oxidization regions 131O and the second insulating layers 133. The channel layer may further include the second channel layer CH2 disposed inside the second source side through-hole H2T_S, the second source side pipe through-hole H2B_S, the second concave portion PT2, the second drain side pipe through-hole H2B_D, and the second drain side through-hole H2T_D. The second channel layer CH2 includes the second source side channel layer S_CH2, the second pipe channel layer P_CH2, and the second drain side channel layer D_CH2. The second source side channel layer S_CH2 may be disposed inside the second source side through-hole H2T_S, and be surrounded by the sacrificial oxidization regions 131O and the second insulating layers 133. The second pipe channel layer P_CH2 may be disposed inside the second source side pipe through-hole H2B_S, the second concave portion PT2, and the second drain side pipe through-hole H2B_D, and be surrounded by the second oxidization layer 121BO. The second drain side channel layer D_CH2 may be disposed inside the second drain side through-hole H2T_D, and be surrounded by the sacrificial oxidization regions 131O and the second insulating layers 133.

Referring to FIG. 4B, after the channel layer CH1 or CH2 is formed, the slit 145 passing through the second insulating layers 133 and the non-oxidization regions 131NO between the source side through-hole H1T_S or H2T_S and the drain side through-hole H1T_D or H2T_D is formed. For example, the slit 145 may be formed by etching the second insulating layers 133 and the non-oxidization regions 131NO between the second source side through-hole H2T_S and the second drain side through-hole H2T_D. The slit 145 may be extended into the first insulating layer 111.

Subsequently, openings OP exposing the oxidization regions 131O are formed by removing the non-oxidization regions 131NO exposed through the slit 145. The openings OP may be defined between the second insulating layers 133, and between the first insulating layer 111 and the lowermost layer adjacent to the first insulating layer 111 among the second insulating layers 133. The oxidization regions 131O may serve as an etching stop layer and protect the channel layer CH1 or CH2 during the etching process of removing the non-oxidization regions 131NO.

Then, a width of each of the openings OP may be increased by removing the oxidization regions 131O through the slit 145. Next, a memory layer 161 is formed along the surfaces of the openings OP and the slit 145. Although not illustrated in the drawing, the tunnel insulating layer may be further formed along the surfaces of the openings OP and the slit 145 before the memory layer 161 is formed, and the charge blocking layer may be further formed along the surfaces of the openings OP and the slit 145 after the memory layer 161 is formed.

Referring to FIG. 4C, the memory layer 161 may be separated into the plurality of memory patterns 161P by forming etching barrier patterns (not illustrated) filled inside the openings OP and then removing some regions of the memory layer 161 along the lateral wall of the slit 145. Subsequently, the memory patterns 161P formed along the surfaces of the openings OP may be exposed by removing the etching barrier patterns (not illustrated). Next, the conductive patterns 151 filled inside the openings OP are formed on the memory patterns 161P. Before the conductive patterns 151 are formed, the charge blocking layer may be further formed along the surfaces of the memory patterns 161 and the surface of the slit 145.

The embodiments may prevent a phenomenon, in which a thickness of the oxidization layer between the pipe gate and the pipe channel layer is excessively increased by oxidization of the pipe gate, by forming a passivation layer so as to prevent the pipe gate from being oxidized. Accordingly, the embodiments may provide a pipe transistor having a stable structure, and prevent a phenomenon, in which a width of a pipe through-hole is excessively decreased.

The embodiments may form the oxidization layer serving as a gate insulating layer between the pipe gate and the pipe channel layer by oxidizing the passivation layer.

The embodiments may form the pipe through-hole connected to the concave portion of the pipe gate while passing through the pipe gate, and then form the through-hole passing through the sacrificial layers and the insulating layers stacked on the pipe gate so as to be arranged in the pipe through-hole. Accordingly, the embodiments may decrease a thickness of an etching mask used for forming the through-hole, prevent a phenomenon, in which the pipe through-hole disposed under the through-hole is not opened, decrease a phenomenon, in which a structure of the pipe through-hole is distorted, and secure an etching margin of the through-hole.

The embodiments may form the pipe through-hole after filling the concave portion of the pipe gate with the buried layer, remove the buried layer through the pipe through-hole, and then fill the concave portion and the pipe through-hole with the gap fill layer. Accordingly, a chemical property of the buried layer may be selected considering tolerance to etching materials for forming the pipe through-hole, and be selected regardless of chemical properties of the sacrificial layers and the insulating layers. That is, according to the various embodiments, a range of the selection of a chemical property of the buried layer may be increased.

Figure 5:
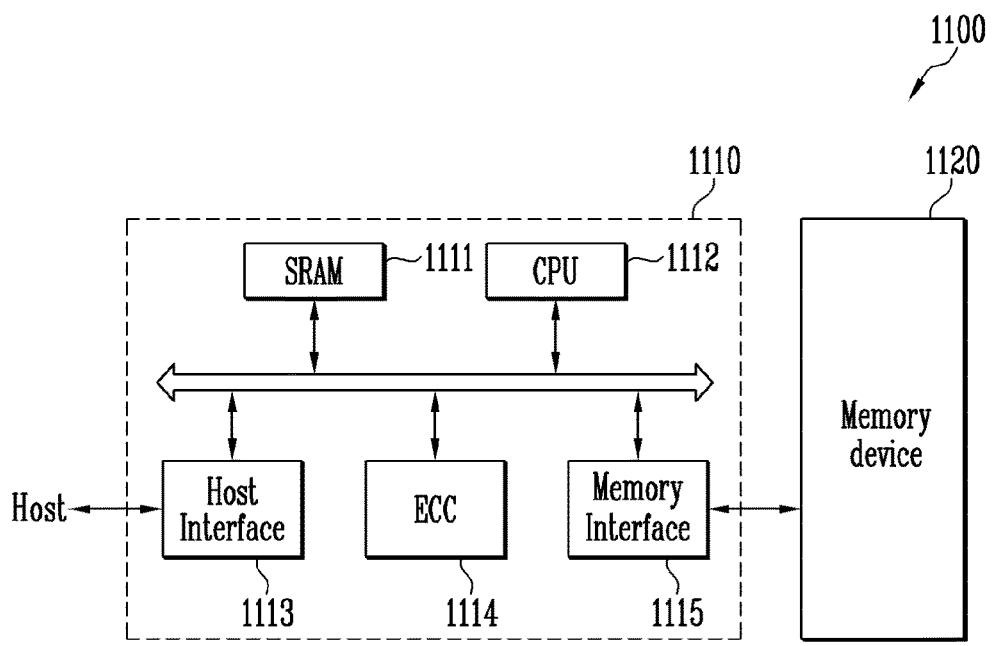
FIG. 5 is a configuration diagram illustrating a representation of an example of a memory system according to an embodiment.

FIG. 5 is a configuration diagram illustrating a representation of an example of a memory system according to an embodiment.

Referring to FIG. 5, a memory system 1100 according to an example of an embodiment of the present disclosure may include a memory device 1120 and a memory controller 1110.

The memory device 1120 may have the structures described in the embodiments described with reference to FIGS. 1 to 4C. For example, the memory device 1120 may include a pipe channel layer, a pipe gate surrounding the pipe channel layer, an oxidization layer formed between the pipe gate and the pipe channel layer, and a source side channel layer and a drain side channel layer extended from the pipe channel layer so as to further protrude than the oxidization layer. Further, the memory device 1120 may be a multi-chip package formed of a plurality of flash memory chips.

The memory controller 1110 may be configured to control the memory device 1120, and may include an SRAM 1111, a CPU 1112, a host interface 1113, an ECC 1114, and a memory interface 1115. The SRAM 1111 is used as an operation memory of the CPU 1112, the CPU 1112 performs a general control operation for data exchange of the memory controller 1110, and the host interface 1113 includes a data exchange protocol of the host connected to the memory system 1100. Further, the ECC 1114 detects and corrects an error included in data read from the memory device 1120, and the memory interface 1115 performs interfacing with the memory device 1120. In addition, the memory controller 1110 may further include an ROM and the like for storing code data for the interfacing with the host.

As described above, the memory system 1100 including the aforementioned configuration may be a memory card or a Solid State Disk (SSD) in which the memory device 1120 is combined with the memory controller 1110. For example, when the memory system 1100 is the SSD, the memory controller 1110 may communicate with an external device (for example, a host) through one of various interface protocols, such as USB, MMC, PCI-E, SATA, PATA, SCSI, ESDI, and IDE etc.

Figure 6:
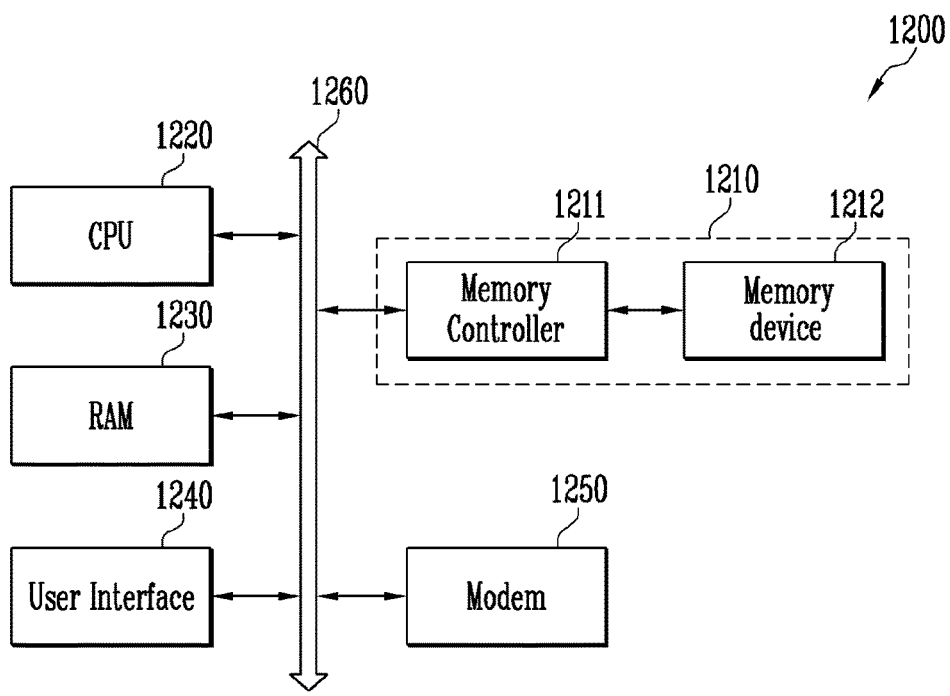
FIG. 6 is a configuration diagram illustrating a representation of an example of a computing system according to an embodiment.

FIG. 6 is a configuration diagram illustrating a representation of an example of a computing system according to an embodiment.

Referring to FIG. 6, a computing system 1200 according to the embodiments of the present disclosure may include a CPU 1220, a RAM 1230, a user interface 1240, a modem 1250, and a memory system 1210, which are electrically connected to a system bus 1260. Further, in a case where the computing system 1200 is a mobile device, the computing system 1200 may further include a battery for supplying an operational voltage to the computing system 1200, and may further include an application chip-set, a camera image sensor CIS, a mobile DRAM, and the like.

The memory system 1210 may be formed of a memory device 1212 and a memory controller 1211 as previously described with reference to FIG. 5.

As described above, the embodiments have been disclosed in the drawings and the specification. The specific terms used herein are for purposes of illustration, and do not limit the scope of the present disclosure defined in the claims. Accordingly, those skilled in the art will appreciate that various modifications and other equivalent examples may be made without departing from the scope and spirit of the present disclosure. Therefore, the sole technical protection scope of the present disclosure will be defined by the technical spirit of the accompanying claims.

What is claimed is:

1. A method of manufacturing a semiconductor device, comprising:
   forming a lower structure including a gap fill layer, a pipe gate surrounding the gap fill layer, and a passivation layer disposed between the pipe gate and the gap fill layer;
   alternately stacking sacrificial layers and insulating layers on the lower structure;
   forming a source side through-hole and a drain side through-hole exposing the gap fill layer by etching the sacrificial layers and the insulating layers;
   exposing the passivation layer by removing the gap fill layer through the source side through-hole and the drain side through-hole;
   forming a passivation oxidization region, which is the oxidized passivation layer, and sacrificial oxidization regions, which are oxidized lateral walls of the sacrificial layers exposed through the source side through-hole and the drain side through-hole, by the oxidization process; and
   forming a channel layer surrounded by the passivation oxidization region and the sacrificial oxidization regions and filling the source side through-hole, the drain side through-hole and a region, in which the gap fill layer are removed,
   wherein the forming of the lower structure includes:
   forming the pipe gate having a structure surrounding a buried layer;
   forming a source side pipe through-hole and a drain side pipe through-hole by etching a part of the pipe gate so that the buried layer is exposed;
   increasing widths of the source side pipe through-hole and the drain side pipe through-hole by an etching process;
   removing the buried layer through the source side pipe through-hole and the drain side pipe through-hole;
   forming the passivation layer along a surface of a region, in which the buried layer is removed, and surfaces of the source side pipe through-hole and the drain side pipe through-hole; and
   forming the gap fill layer filled in the region, in which the buried layer is removed, and inside the source side pipe through-hole and the drain side pipe through-hole on the passivation layer.

2. The method of claim 1, wherein the buried layer and the sacrificial layers are formed of substantially the same material.

3. The method of claim 1, wherein tolerance to the etching process of the buried layer is larger than that of the gap fill layer.

4. The method of claim 1, wherein the buried layer includes a nitride layer, and the gap fill layer includes a metal.

5. The method of claim 1, further comprising:
   forming a memory layer along surfaces of the source side through-hole, the drain side through-hole, and the passivation oxidization region before the forming of the channel layer;
   forming a slit by etching the sacrificial layers and the insulating layers between the source side through-hole and the drain side through-hole after the forming of the channel layer;
   removing the sacrificial layers through the slit so that the sacrificial oxidization regions are exposed;
   removing the sacrificial oxidization regions through the slit; and
   filling regions, in which the sacrificial layers and the sacrificial oxidization regions are removed, with conductive patterns.

6. The method of claim 1, further comprising:
   forming a slit by etching the sacrificial layers and the insulating layers between the source side through-hole and the drain side through-hole after the forming of the channel layer;
   removing the sacrificial layers through the slit so that the sacrificial oxidization regions are exposed;
   forming openings between the insulating layers by removing the sacrificial oxidization regions through the slit;
   forming memory patterns along surfaces of the openings; and
   filling inside the openings with conductive patterns on the memory patterns.

7. A method of manufacturing a semiconductor device, comprising:
   forming a lower structure including a first pipe gate, a second pipe gate stacked on the first pipe gate, a third pipe gate stacked on the second pipe gate, a first insulating layer stacked on the third pipe gate, a first gap fill layer, which passes through the first insulating layer, the third pipe gate, and the second pipe gate, is filled in a first concave portion of the first pipe gate, and is surrounded by a first passivation layer, and a second gap fill layer, which passes through the first insulating layer and the third pipe gate, is filled in a second concave portion of the second pipe gate, and is surrounded by a second passivation layer;
   alternately stacking sacrificial layers and second insulating layers on the lower structure;
   forming a first source side through-hole and a first drain side through-hole exposing the first gap fill layer and a second source side through-hole and a second drain side through-hole exposing the second gap fill layer by etching the sacrificial layers and the second insulating layers;
   exposing the first and second passivation layers by removing the first and second gap fill layers through the first and second source side through-holes and the first and second drain side through-holes;
   forming a first passivation oxidization region, which is the oxidized first passivation layer, a second passivation oxidization region, which is the oxidized second passivation layer, and sacrificial oxidization regions, which are oxidized lateral walls of the sacrificial layers exposed through the first and second source side through-holes and the first and second drain side through-holes, by an oxidization process; and
   forming a first channel layer disposed within the first source side through-hole, the first drain side through-hole, and a region, in which the first gap fill layer is removed, and surrounded by the first passivation oxidization region and the sacrificial oxidization regions, and a second channel layer disposed within the second source side through-hole, the second drain side through-hole, and a region, in which the second gap fill layer is removed, and surrounded by the second passivation oxidization region and the sacrificial oxidization regions.

8. The method of claim 7, further comprising:
the forming of the lower structure includes:

forming the first pipe gate having the first concave portion filled with a first buried layer;

forming the second pipe gate having the second concave portion filled with a second buried layer on the first pipe gate;

forming the third pipe gate on the second pipe gate;

forming the first insulating layer on the third pipe gate;

forming a first source side pipe through-hole and a first drain side pipe through-hole exposing the first buried layer and a second source side pipe through-hole and a second drain side pipe through-hole exposing the second buried layer by etching at least one of the first insulating layer, the third pipe gate, and the second pipe gate;

opening the first and second concave portions by removing the first and second buried layers through the first and second source side pipe through-holes and the first and second drain side pipe through-holes;

forming the first passivation layer along surfaces of the first concave portion, the first source side pipe through-hole, and the first drain side pipe through-hole, and the second passivation layer along surfaces of the second concave portion, the second source side pipe through-hole, and the second drain side pipe through-hole; and forming the first gap fill layer filled in the first concave portion, the first source side pipe through-hole, and the first drain side pipe through-hole on the first passivation layer, and the second gap fill layer filled in the second concave portion, the second source side pipe through-hole, and the second drain side pipe through-hole on the second passivation layer.

9. The method of claim 8, wherein the first and second buried layers and the sacrificial layers are formed of substantially the same material.

10. The method of claim 8, further comprising:
increasing widths of the first and second source side pipe through-holes and the first and second drain side pipe through-holes by a wet etching process before the removing of the first and second buried layers.

11. The method of claim 10, wherein tolerance to the wet etching process of the first and second buried layers is larger than that of the first and second gap fill layers.

12. The method of claim 8, wherein the first and second buried layers include a nitride layer, and the first and second gap fill layers include a metal.

13. The method of claim 7, further comprising:
forming a first memory layer along surfaces of the first source side through-hole, the first drain side through-hole, and the first passivation oxidization region, and a second memory layer along surfaces of the second source side through-hole, the second drain side through-hole, and the second passivation oxidization region before the forming of the first and second channel layers; and forming a slit by etching the sacrificial layers and the second insulating layers between the second source side through-hole and the second drain side through-hole after the forming of the first and second channel layers;

removing the sacrificial layers through the slit so that the sacrificial oxidization regions are exposed;

removing the sacrificial oxidization regions through the slit; and filling regions, in which the sacrificial layers and the sacrificial oxidization regions are removed, with conductive patterns.

14. The method of claim 7, further comprising:
forming a slit by etching the sacrificial layers and the second insulating layers between the second source side through-hole and the second drain side through-hole after the forming of the first and second channel layers;

removing the sacrificial layers through the slit so that the sacrificial oxidization regions are exposed;

forming openings between the second insulating layers by removing the sacrificial oxidization regions through the slit;

forming memory patterns along surfaces of the openings; and filling inside the openings with conductive patterns on the memory patterns.

15. The method of claim 1, wherein the buried layer, the gap fill layer and the channel layer are formed in a same region at different times.

16. The method of claim 1, wherein the buried layer, the gap fill layer and the channel layer are formed of different materials from each other.

17. A method of manufacturing a semiconductor device, comprising:
forming a pipe gate having a first region filling a buried layer;

forming a source side pipe through-hole and a drain side pipe through-hole by etching a part of the pipe gate so that the buried layer is exposed;

removing the buried layer through the source side pipe through-hole and the drain side pipe through-hole;

forming a gap fill layer filled in the first region, the source side pipe through-hole and the drain side pipe through-hole;

alternately stacking sacrificial layers and insulating layers on the pipe gate surrounding the gap fill layer;

forming a source side through-hole and a drain side through-hole exposing the gap fill layer by etching the sacrificial layers and the insulating layers;

removing the gap fill layer through the source side through-hole and the drain side through-hole; and forming a channel layer in the source side through-hole, the drain side through-hole and the first region;

wherein after the removing the buried layer from the first region and before forming the channel layer in the first region, the gap fill layer is formed in the first region and removed therefrom.

18. The method of claim 17, wherein the buried layer and the gap fill layer and the channel layer are formed of different materials from each other.

* * * * *